(12) United States Patent
Lee et al.

(10) Patent No.: US 10,559,590 B2
(45) Date of Patent: Feb. 11, 2020

(54) THREE-DIMENSIONAL SEMICONDUCTOR DEVICES

(71) Applicant: SAMSUNG ELECTRONICS CO., LTD., Suwon-si, Gyeonggi-do (KR)

(72) Inventors: Changhyun Lee, Suwon-si (KR); Chanjin Park, Yongin-si (KR); Byoungkeun Son, Suwon-si (KR); Sung-Il Chang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/021,295

(22) Filed: Jun. 28, 2018

(65) Prior Publication Data

US 2018/0323209 A1 Nov. 8, 2018

Related U.S. Application Data

(60) Continuation of application No. 15/392,521, filed on Dec. 28, 2016, now Pat. No. 10,038,007, which is a continuation of application No. 14/657,849, filed on Mar. 13, 2015, now Pat. No. 9,536,895, which is a
(Continued)

(30) Foreign Application Priority Data

Nov. 5, 2010 (KR) ........................ 10-2010-0110033

(51) Int. Cl.
| | | |
|---|---|---|
| H01L 27/11578 | (2017.01) | |
| H01L 27/11582 | (2017.01) | |
| H01L 27/11551 | (2017.01) | |
| H01L 27/11556 | (2017.01) | |
| H01L 29/06 | (2006.01) | |
| H01L 29/792 | (2006.01) | |

(52) U.S. Cl.
CPC .. H01L 27/11582 (2013.01); H01L 27/11551 (2013.01); H01L 27/11556 (2013.01); H01L 27/11578 (2013.01); H01L 29/0649 (2013.01); H01L 29/7926 (2013.01)

(58) Field of Classification Search
CPC ................................................ H01L 27/11578
See application file for complete search history.

(56) References Cited

U.S. PATENT DOCUMENTS

| | | |
|---|---|---|
| 7,847,334 B2 | 12/2010 | Katsumata et al. |
| 7,927,953 B2 | 4/2011 | Ozawa |
| 8,013,389 B2 | 9/2011 | Oh et al. |

(Continued)

FOREIGN PATENT DOCUMENTS

| | | |
|---|---|---|
| CN | 101192621 A | 6/2008 |
| JP | 2008-072051 A | 3/2008 |

(Continued)

*Primary Examiner* — Dale E Page
*Assistant Examiner* — Christopher A Johnson
(74) *Attorney, Agent, or Firm* — Lee & Morse, P.C.

(57) ABSTRACT

A three-dimensional semiconductor device includes an upper structure on a lower structure, the upper structure including conductive patterns, a semiconductor pattern connected to the lower structure through the upper structure, and an insulating spacer between the semiconductor pattern and the upper structure, a bottom surface of the insulating spacer being positioned at a vertical level equivalent to or higher than an uppermost surface of the lower structure.

14 Claims, 42 Drawing Sheets

Related U.S. Application Data division of application No. 13/290,425, filed on Nov. 7, 2011, now Pat. No. 8,981,458.

(56) References Cited

U.S. PATENT DOCUMENTS

| | | | |
|---|---|---|---|
| 8,319,275 B2 | 11/2012 | Shim et al. | |
| 8,395,206 B2 | 3/2013 | Lee et al. | |
| 2005/0056615 A1* | 3/2005 | Moll | H01L 21/31122 216/67 |
| 2007/0029602 A1 | 2/2007 | Lin et al. | |
| 2008/0067583 A1 | 3/2008 | Kidoh et al. | |
| 2008/0123390 A1 | 5/2008 | Kim et al. | |
| 2008/0179659 A1 | 7/2008 | Enda et al. | |
| 2009/0146190 A1 | 6/2009 | Fukuzumi et al. | |
| 2009/0230450 A1 | 9/2009 | Shiino et al. | |
| 2009/0310425 A1* | 12/2009 | Sim | H01L 27/11526 365/185.29 |
| 2010/0078701 A1 | 4/2010 | Shim et al. | |
| 2010/0109065 A1* | 5/2010 | Oh | H01L 27/0688 257/314 |
| 2010/0140684 A1* | 6/2010 | Ozawa | H01L 21/28282 257/324 |
| 2010/0248439 A1 | 9/2010 | Chung et al. | |
| 2010/0270529 A1 | 10/2010 | Lung | |
| 2011/0233648 A1 | 9/2011 | Seol et al. | |
| 2012/0001250 A1 | 1/2012 | Alsmeier | |
| 2012/0001252 A1 | 1/2012 | Alsmeier et al. | |
| 2012/0003828 A1 | 1/2012 | Chang et al. | |
| 2012/0083077 A1 | 4/2012 | Yang et al. | |

FOREIGN PATENT DOCUMENTS

| | | |
|---|---|---|
| JP | 2009-135328 A | 6/2009 |
| JP | 2009-224465 A | 10/2009 |
| KR | 10-2010-0034612 A | 4/2010 |
| KR | 10-2010-0039919 A | 4/2010 |
| KR | 10-2010-0067055 A | 6/2010 |
| KR | 10-2010-0096865 A | 9/2010 |
| KR | 10-2010-0100397 A | 9/2010 |
| KR | 10-2010-0107661 A | 10/2010 |

* cited by examiner $2 \cdot L < \text{Length}(a,b) \leq 4 \cdot L$

THREE-DIMENSIONAL SEMICONDUCTOR DEVICES

CROSS-REFERENCE TO RELATED APPLICATIONS

This is a continuation application based on application Ser. No. 15/392,521, filed Dec. 28, 2016, which in turn is a continuation of application Ser. No. 14/657,849, filed Mar. 13, 2015, now U.S. Pat. No. 9,536,895 B2, issued Jan. 3, 2017, which in turn is a division of Ser. No. 13/290,425, filed Nov. 7, 2011, now U.S. Pat. No. 8,981,458 B2 issued Mar. 17, 2015, the entire contents of which is hereby incorporated by reference.

This U.S. non-provisional patent application claims priority under 35 U.S.C. § 119 to Korean Patent Application No. 10-2010-0110033, filed on Nov. 5, 2010, in the Korean Intellectual Property Office, the entire contents of which are hereby incorporated by reference.

BACKGROUND

1. Field

Example embodiments of the inventive concepts relate to semiconductor devices and methods of fabricating the same, and more particularly, to three-dimensional semiconductor memory devices including three-dimensionally arranged memory cells and methods of fabricating the same.

2. Description of the Related Art

A three dimensional integrated circuit (3D-IC) memory technique may be used for increasing a memory capacity. 3D-IC memory technique refers generally to technologies related to arranging memory cells three-dimensionally. In addition to a 3D-IC memory technique, a memory capacity may be increased through (1) a pattern miniaturization technique, and (2) a multi-level cell (MLC) technique. However, the use of a pattern miniaturization technique may be limited due to high cost, and the capacity increase achieved by the MLC technique may be limited to the number of bits to be increased in each cell. The pattern miniaturization technique and the MLC techniques may be combined with the 3D-IC technique, in terms of realizing a more increased memory capacity, and may be expected to develop separately from the 3D-IC technique.

One 3D-IC technique is a punch-and-plug technique. The punch-and-plug technique includes sequentially forming multi-layered thin layers on a substrate and then forming plugs to penetrate the thin layers. Through this technique, without a drastic increase of manufacturing costs, a memory capacity of a three-dimensional memory device may be achieved.

SUMMARY

Embodiments of the inventive concepts provide three-dimensional semiconductor devices configured to reduce electric resistance of an electric current path therein.

Other embodiments of the inventive concepts provide methods of fabricating a three-dimensional semiconductor device configured to reduce electric resistance of an electric current path therein.

According to example embodiments of the inventive concepts, a three-dimensional semiconductor device may include an upper structure on a lower structure, the upper structure including conductive patterns, a semiconductor pattern connected to the lower structure through the upper structure, and an insulating spacer between the semiconductor pattern and the upper structure, a bottom surface of the insulating spacer being positioned at a vertical level equivalent to or higher than an uppermost surface of the lower structure.

The lower structure may include a semiconductor substrate, the semiconductor pattern being directly connected to the semiconductor substrate.

The semiconductor substrate may include a doped region spaced apart from the semiconductor pattern, the doped region having a different conductivity type from the semiconductor pattern, and a connection region directly connected to the semiconductor pattern, the connection region having the same conductivity type as the semiconductor pattern.

The lower structure may include a substrate and a selection transistor interposed between the substrate and the upper structure, the selection transistor including a selection semiconductor pattern directly connected to the semiconductor pattern, and the bottom surface of the insulating spacer being positioned at a vertical level equivalent to or higher than an uppermost surface of the selection semiconductor pattern.

The lower structure may include three-dimensionally arranged lower memory devices and a pad pattern interposed between the lower memory devices and the semiconductor pattern, the bottom surface of the insulating spacer being positioned at a vertical level equivalent to or higher than an uppermost surface of the pad pattern.

The upper structure may further include interlayer dielectric patterns sequentially stacked on the lower structure and interposed between the conductive patterns, and an intermediate layer interposed between the conductive pattern and the semiconductor pattern, the insulating spacer being interposed between the interlayer dielectric pattern and the semiconductor pattern.

A lowermost layer of the interlayer dielectric patterns may be interposed between a lowermost layer of the conductive patterns and the lower structure, the lowermost layer of the interlayer dielectric patterns being in direct contact with the semiconductor pattern.

The lowermost layer of the interlayer dielectric patterns may include at least one of a silicon oxide layer or a high-k dielectric layer.

The lowermost layer of the interlayer dielectric patterns may include aluminum oxide.

A distance between the conductive pattern and the lower structure may be smaller than a thickness of the interlayer dielectric pattern.

The layer may extend horizontally from a region between the conductive pattern and the semiconductor pattern to cover top and bottom surfaces of the conductive pattern.

The intermediate layer may include a tunnel insulating layer, a blocking insulating layer, and a charge storing layer interposed between the tunnel insulating layer and the blocking insulating layer, and each of the tunnel insulating layer and the blocking insulating layer may include an insulating layer having a band gap greater than the charge storing layer, the blocking insulating layer having an effective dielectric constant greater than the tunnel insulating layer.

The insulating spacer may include a plurality of portions, each portion being locally interposed between the semiconductor pattern and the interlayer dielectric patterns, the portions of the insulating spacer being vertically separated by the intermediate layer.

The insulating spacer and the intermediate layer may define a memory layer including a tunnel insulating layer, a blocking insulating layer, and a charge storing layer interposed between the tunnel insulating layer and the blocking insulating layer, and each of the tunnel insulating layer and the blocking insulating layer includes an insulating layer having a band gap greater than the charge storing layer, the blocking insulating layer having an effective dielectric constant greater than the tunnel insulating layer.

The insulating spacer may include the tunnel insulating layer, the intermediate layer includes the blocking insulating layer, and at least one of the insulating spacer and the intermediate layer includes the charge storing layer.

The semiconductor pattern may include a semiconductor core inserted into the lower structure through the insulating spacer, a vertical length of the semiconductor core being longer than that of the insulating spacer.

The upper structure may further include a lowermost interlayer dielectric pattern interposed between a lowermost layer of the conductive patterns and the lower structure, the semiconductor core having a surface in direct contact with a sidewall of the lowermost interlayer dielectric pattern.

The semiconductor pattern may further include a semiconductor spacer interposed between the insulating spacer and the semiconductor core.

The semiconductor core may include an extended portion covering a lower sidewall of the semiconductor spacer and having a top surface located on the uppermost top surface of the lower structure.

The device may further include an insulating gap-filling pattern inserted into the semiconductor core, the insulating gap-filling pattern having a vertical length greater than the upper structure.

The lower structure may have a hole completely filled with the semiconductor core.

According to other example embodiments of the inventive concepts, a three-dimensional semiconductor device may include an upper structure on a lower structure, the upper structure including conductive patterns, a semiconductor pattern extending through an opening in the upper structure, the semiconductor pattern being perpendicular to and connected to the lower structure, and an insulating spacer between the semiconductor pattern and a sidewall of the opening, a space in a bottom of the upper structure separating a lowermost edge of the insulating spacer and an uppermost surface of the lower structure.

According to other example embodiments of the inventive concepts, a method of fabricating a three-dimensional semiconductor device may include forming an upper structure on a lower structure, the upper structure including conductive patterns, forming a semiconductor pattern connected to the lower structure through the upper structure, and forming an insulating spacer between the semiconductor pattern and the upper structure, such that a bottom surface of the insulating spacer is positioned at a vertical level equivalent to or higher than an uppermost surface of the lower structure.

Forming the upper structure on the lower structure may include forming a layer stack on the lower structure, forming the insulating spacer may include forming an insulating layer vertically inserted into the layer stack, and etching a lower region of the insulating layer to form the insulating spacer, such that the insulating spacer exposes a lower sidewall of the layer stack, and forming the semiconductor pattern includes forming the semiconductor pattern in the insulating spacer, such that the semiconductor pattern is directly connected to the lower structure through the layer stack.

Forming the insulating layer may include forming an opening through the layer stack to expose the lower structure, and forming the insulating layer on an inner wall of the opening.

Forming the layer stack may include forming a plurality of horizontal layers sequentially deposited on the lower structure, and forming the insulating layer may include forming an opening in the layer stack, and forming the insulating layer on an inner wall of the opening, such that the opening is spaced apart from the lower structure, and such that at least one of the horizontal layers remains between a bottom surface of the opening and the lower structure.

Forming the semiconductor pattern may further include etching the horizontal layer remaining below the opening to expose the lower structure.

Forming one of the horizontal layers may include forming a layer of aluminum oxide as an etch stop layer during formation of the opening.

Forming the layer stack may include forming alternating first horizontal layers and second horizontal layers on the lower structure, the first horizontal layers being formed of silicon oxide, and the second horizontal layers being formed of a material having an etch selectivity with respect to the first horizontal layers.

Forming the layer stack may include forming one of the first horizontal layers as a lowermost layer.

Forming the layer stack may include forming one of the second horizontal layers as a lowermost layer.

The method may further include, after forming the semiconductor pattern, removing the second horizontal layers to form recess regions exposing a sidewall of the insulating spacer between the first horizontal layers, and forming conductive patterns in the recess regions.

The method may further include, before forming the conductive patterns, forming an intermediate pattern in the recess region, such that the intermediate pattern and the insulating spacer define a memory layer.

The method may further include, before forming the conductive patterns, etching the exposed insulating spacer to expose a sidewall of the semiconductor pattern, and forming an intermediate pattern to cover the exposed sidewall of the semiconductor pattern, such that the insulating spacer remains in regions localized between the semiconductor pattern and the first horizontal layers.

Forming the insulating spacer may include forming a layer of at least one material having an etch selectivity with respect to the second horizontal layer.

Forming the semiconductor pattern may include forming a semiconductor spacer to penetrate the insulating spacer, and forming a semiconductor core directly connected to the lower structure through the semiconductor spacer.

The semiconductor spacer may be used as an etch mask exposing the lower region of the insulating layer, during formation of the insulating spacer.

Forming the insulating spacer may include exposing the lower structure through an insulating layer, and forming the semiconductor pattern includes forming a semiconductor core to cover an inner sidewall of the insulating spacer and the exposed lower structure.

Forming the lower structure may include forming a semiconductor substrate, such that the semiconductor pattern is directly connected to the semiconductor substrate.

Forming the semiconductor substrate may include forming a doped region apart from the semiconductor pattern, the doped region having a different conductivity type from the semiconductor pattern, and forming a connection region directly connected to the semiconductor pattern, the connection region having the same conductivity type as the semiconductor pattern.

Forming the lower structure may include forming a substrate and a selection transistor interposed between the substrate and the upper structure, the selection transistor including a selection semiconductor pattern directly connected to the semiconductor pattern, and the bottom surface of the insulating spacer being positioned at a vertical level higher than the uppermost top surface of the selection semiconductor pattern.

Forming the lower structure may include forming three-dimensionally arranged lower memory devices and a pad pattern interposed between the lower memory devices and the semiconductor pattern, the bottom surface of the insulating spacer being positioned at a vertical level higher than the uppermost top surface of the pad pattern.

BRIEF DESCRIPTION OF THE DRAWINGS

The above and other features and advantages will become more apparent to those of ordinary skill in the art by describing in detail exemplary embodiments with reference to the attached drawings, in which.

Figure 1:
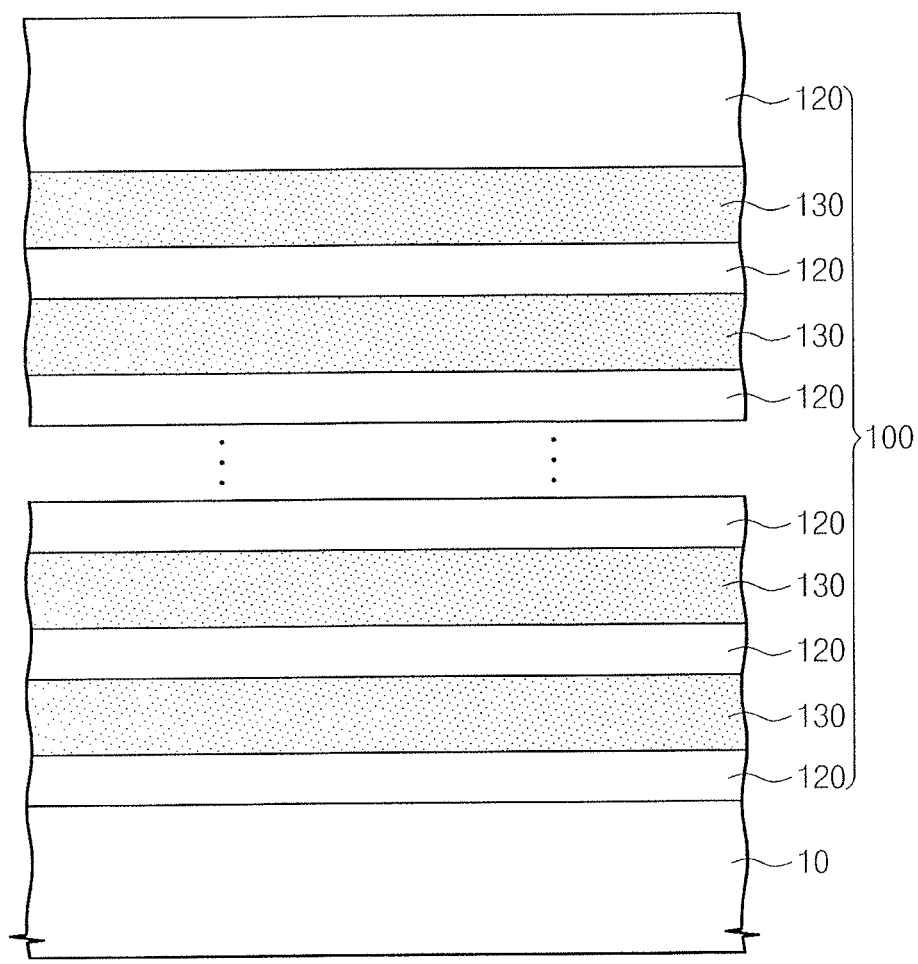
FIGS. 1 through 9 illustrate sectional views of stages in methods of fabricating a three-dimensional semiconductor device according to a first example embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will be understood that when a layer is referred to as being "connected" or "coupled" to another element, it can be directly connected or coupled to the other element or intervening elements may be present. Other words used to describe the relationship between elements or layers should be interpreted in a like fashion (e.g., "between" versus "directly between," "adjacent" versus "directly adjacent," "on" versus "directly on"). Like reference numerals refer to like elements throughout.

As used herein the term "and/or" includes any and all combinations of one or more of the associated listed items. It will also be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[First Example Embodiments]

FIGS. 1 through 9 are sectional views of stages in a method of fabricating a three-dimensional semiconductor device according to a first example embodiment.

Referring to FIG. 1, a layer stack 100 may be formed on a lower structure 10. In some embodiments, the lower structure 10 may be a substrate formed of, e.g., a semiconductor material, an insulating material, or a semiconductor or conductive material covered with an insulating layer. For example, the lower structure 10 may be a silicon wafer.

In other embodiments, the lower structure 10 may further include at least one transistor interposed between the substrate and the layer stack 100. In the following description, for easier understanding of example embodiments of the inventive concepts, example embodiments may be described with the layer stack 100 directly formed on the lower structure 10 or the substrate. However, example embodiments of the inventive concepts are not limited thereto.

The layer stack 100 may include a plurality of interlayer dielectrics 120 and a plurality of sacrificial layers 130. The interlayer dielectrics 120 and the sacrificial layers 130 may be stacked in an alternating manner, as shown in FIG. 1. According to the present embodiments, one of the interlayer dielectrics 120 may be used as the lowermost layer of the layer stack 100. That is, one of the interlayer dielectrics 120 may be in direct contact with the lower structure 10, and the sacrificial layer 130 may be spaced apart from the lower structure 10.

The sacrificial layer 130 may include at least one material with an etch selectivity with respect to the interlayer dielectric 120. In other words, the interlayer dielectric 120 may include a material that is etched at a slower rate than the sacrificial layer 130 with respect to an etchant for etching the sacrificial layer 130. The etch selectivity may be quantitatively expressed as a ratio of an etch speed of a material of the sacrificial layer 130 to a material of the interlayer dielectric 120. In some embodiments, the sacrificial layer 130 may be one or more materials providing an etch selectivity of about 1:10 to about 1:200, e.g., about 1:30 to about 1:100, with respect to one or more materials of the interlayer dielectric 120. For example, the interlayer dielectric 120 may be at least one of a silicon oxide and a silicon nitride, and the sacrificial layer 130 may be at least one of silicon, a silicon oxide, a silicon carbide, and silicon nitride. The sacrificial layer 130 may be selected to be a different material from the interlayer dielectric 120. In the following description, for easier understanding of example embodiments of the inventive concepts, example embodiments will be described with respect to an interlayer dielectric 120 including silicon oxide and to a sacrificial layer 130 including silicon nitride. However, example embodiments are not limited to silicon oxide and silicon nitride, and each layer is not limited to a single material.

Figure 2:
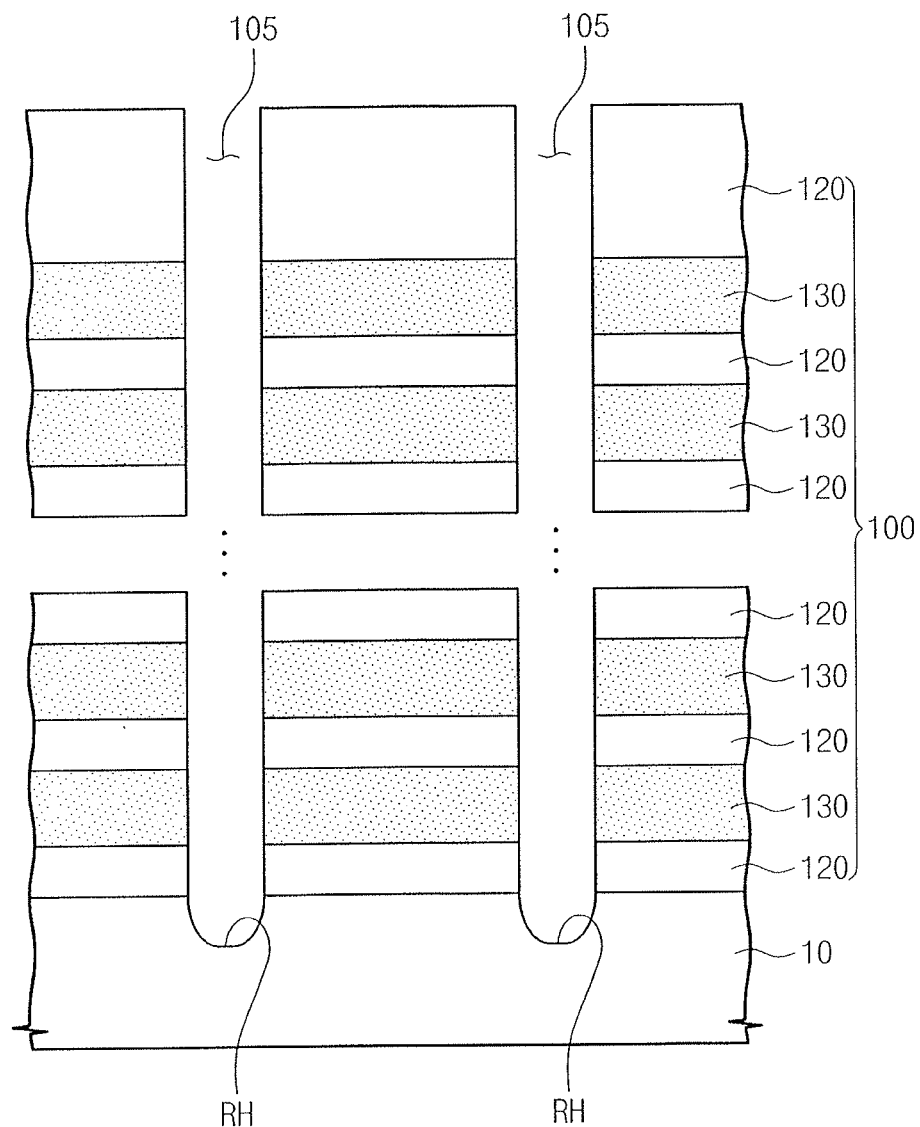

Referring to FIG. 2, openings 105 may be formed to penetrate the layer stack 100. In some embodiments, the openings 105 may be formed to have, e.g., a hole shape. Each of the openings 105 may be formed to have a shape having a depth that is at least five times its width, e.g., an aspect ratio of about 5. According to the present embodiments, the openings 105 may be two-dimensionally formed on the top surface (i.e., the xy plane) of the lower structure 10. For example, each opening 105 may be an isolated region spaced apart from other openings 105 along each of the x and y directions.

In other embodiments, each of the openings 105 may include, e.g., a hexahedral portion, in which its section projected on the top surface (i.e., the xy plane) of the lower structure 10 may have an aspect ratio greater than about 5.

For instance, the opening 105 may be formed to horizontally cross or cut the layer stack 100.

The forming of the openings 105 may include forming a mask pattern defining positions of the openings 105 on the layer stack 100 and, e.g., anisotropically etching the layer stack 100 using the mask pattern as an etch mask.

Since the layer stack 100 may include two kinds of different layers, the sidewall of the opening 105 may not be completely perpendicular with respect to the top surface of the lower structure 10, unlike that shown in FIG. 2. For example, the opening 105 may be tapered downwardly, i.e., the width of the opening 105 may decrease with decreasing distance from the lower structure 10. This non-uniform width of the opening 105 may cause non-uniformity in operational characteristics of three-dimensionally arranged transistors. Detailed description of this non-uniformity and methods of improving the same may be disclosed in U.S. patent application Ser. No. 12/420,518, the entire contents of which are incorporated as part of this application.

According to the present embodiments, the opening 105 may be formed to expose the top surface of the lower structure 10. In addition, the lower structure 10 below the opening 105 may be recessed due to over-etch during the anisotropic etching of the layer stack 100 to have a recessed hole RH. For example, the opening 105 and the recessed hole RH may overlap and have same widths to define a uniform tunnel structure.

Figure 3:
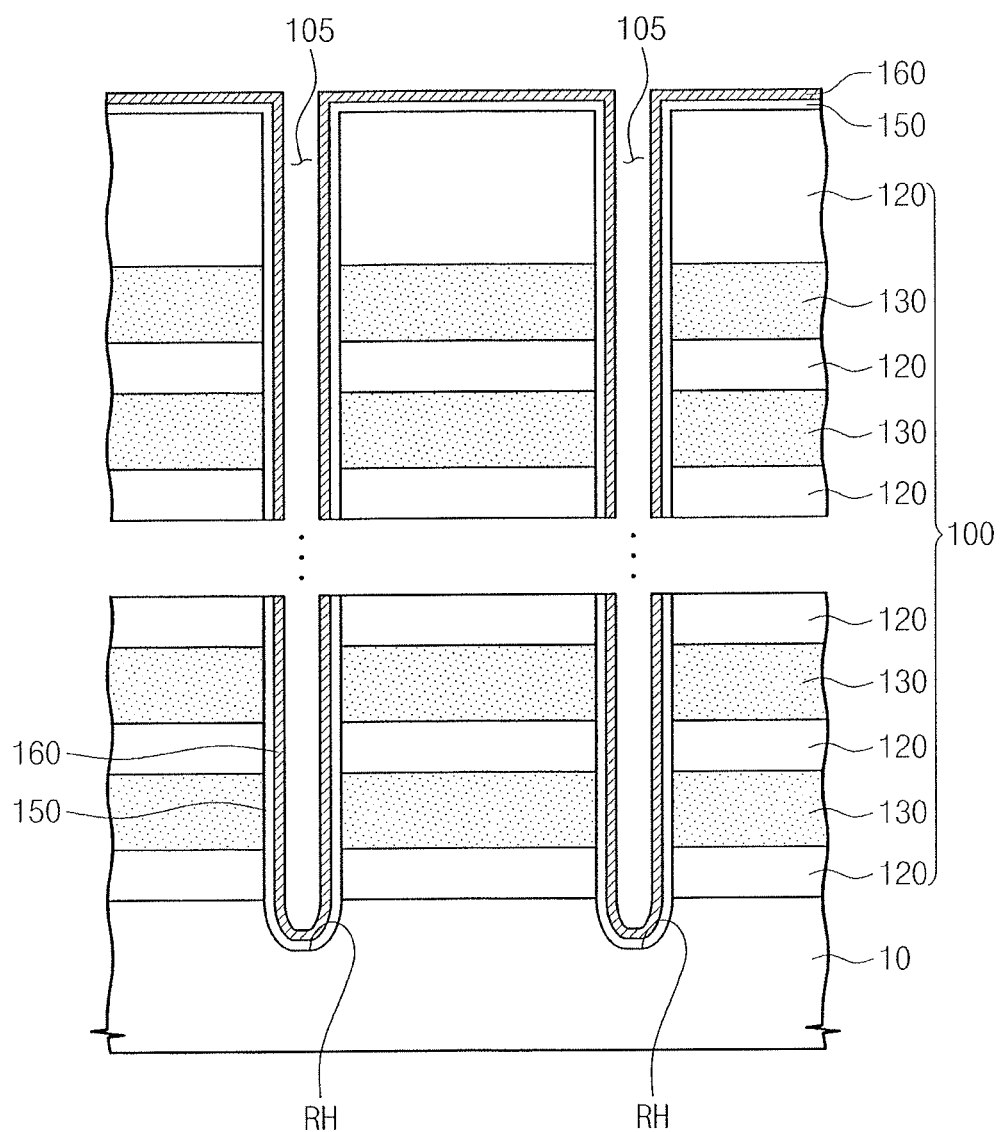

Referring to FIG. 3, a vertical layer 150 and a first semiconductor layer 160 may be sequentially formed to cover inner walls of the openings 105 and the recessed hole RH. The vertical layer 150 and the first semiconductor layer 160 may be conformally formed on the layer stack 100, i.e., may coat the inner walls of the openings 105 without completely filling the opening 105. As used herein, conformality is a layer property describing how well the topography of the underlying surface is replicated. For example, a conformal layer has a substantially same shape as its underlying surface, i.e., the surface it covers, and/or has a substantially same thickness throughout. For example, the vertical layer 150 and the first semiconductor layer 160 may be formed to have a thickness of about, e.g., 1/50 to 1/5 of the width of the opening 105.

According to some aspects of the inventive concepts, the vertical layer 150 may be formed to have a single- or multi-layered structure. For example, the vertical layer 150, i.e., an insulating spacer 150, may include at least one of layers constituting a memory element of a charge trap type nonvolatile memory transistor. According to other aspects of the inventive concepts, the vertical layer 150 may be formed of an insulating material having an etch selectivity with respect to the sacrificial layer 130. Example embodiments of the inventive concepts may be diversely classified according to the layers of the vertical layer 150, as will be described in more detail below with reference to Table 1 and FIGS. 11 through 14.

The first semiconductor layer 160 may be a semiconductor layer (e.g., a polycrystalline silicon layer) formed using one of, for example, atomic layer deposition (ALD) and chemical vapor deposition (CVD). In some embodiments, the first semiconductor layer 160 may be, for example, one of an organic semiconductor layer and carbon nano structures.

Figure 4:
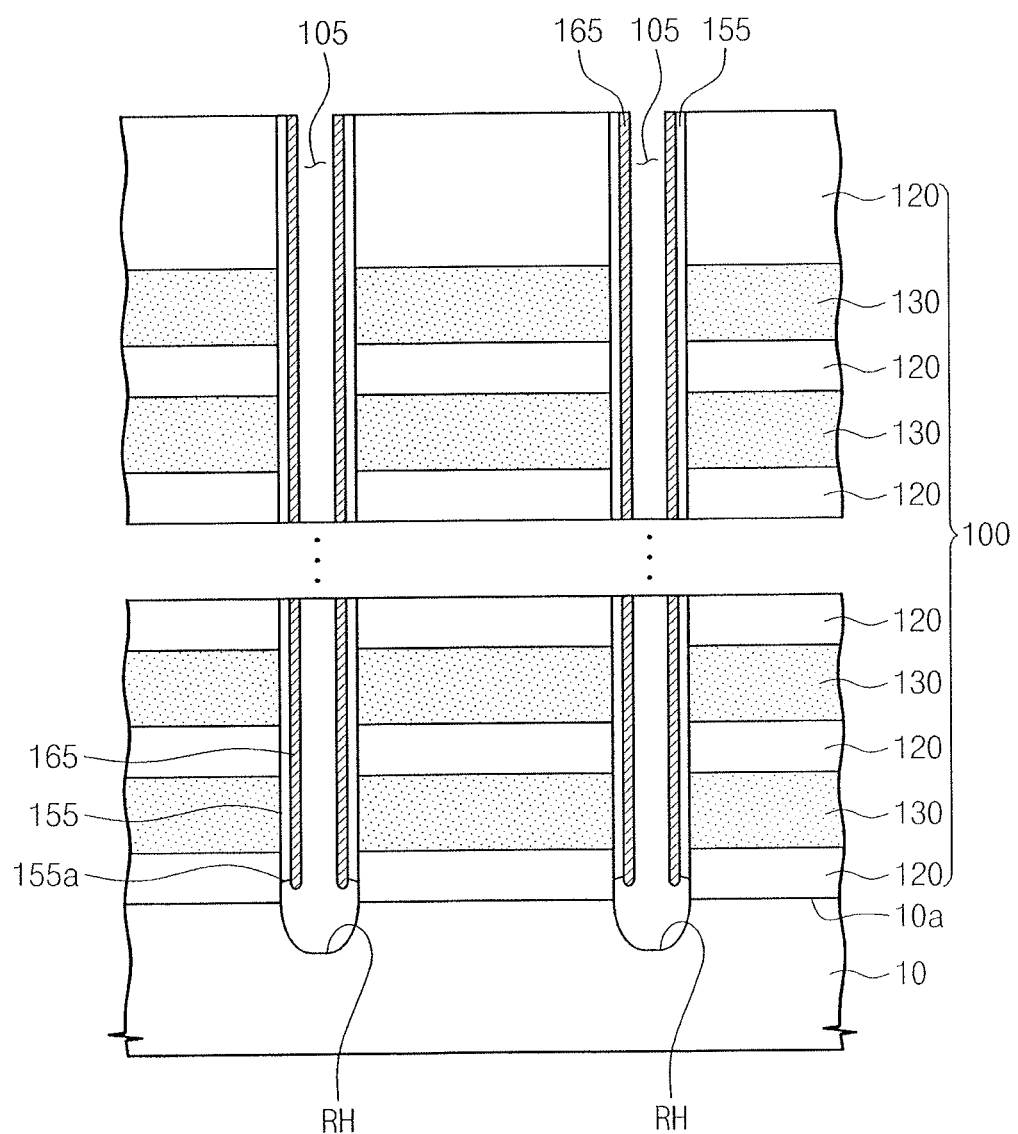

Referring to FIG. 4, the first semiconductor layer 160 and the vertical layer 150 may be patterned to form a first semiconductor pattern 165 (or a semiconductor spacer) and a vertical pattern 155 (or an insulating spacer) exposing the inner wall of the recessed hole RH again.

Formation of the vertical pattern 155 and the first semiconductor pattern 165 may include anisotropically etching the first semiconductor layer 160 and the vertical layer 150 to expose the top surface of the lower structure 10 at the bottom of the openings 105. The vertical pattern 155 and the first semiconductor pattern 165 may be formed to have, e.g., a cylindrical shape with open ends. Although not depicted, the top surface of the lower structure 10 exposed by the semiconductor pattern 165 may be additionally recessed by over etching during the anisotropic etching of the first semiconductor layer 160.

In some embodiments, an exposed surface of the vertical pattern 155 may be further etched using the first semiconductor pattern 165 as an etch mask. In this case, as shown in FIG. 4, an undercut region may be formed below the first semiconductor pattern 165, and the vertical pattern 155 may have a vertical length shorter than the first semiconductor pattern 165. In other words, a distance between a bottom edge 155a of the vertical pattern 155 to a bottom of the opening 105 may be larger than a distance between an uppermost surface 10a of the lower structure 10 to the bottom of the opening 105, so the edge 155a may be spaced apart from the upper most surface 10a. That is, the vertical pattern 155 may extend only along an upper part of the lowermost dielectric layer 120, so a bottom part of the lowermost dielectric layer 120 may be between the edge 155a and the uppermost surface 10a of the lower structure 10.

According to the present embodiments, as shown in FIG. 4, the undercut region may be formed to expose at least a lower sidewall of the layer stack 100. In other words, a bottom surface of the vertical pattern 155 may be positioned at a level higher than a bottom surface of the layer stack 100, so the lower sidewall of the layer stack 100, i.e., a lower portion of the lowermost dielectric layer 120, may be exposed.

In addition, a top surface of the layer stack 100 may be exposed by anisotropically etching the first semiconductor layer 160 and the vertical layer 150. As a result, each of the vertical patterns 155 and each of the first semiconductor patterns 165 may be localized within the corresponding one of the openings 105. For instance, the vertical patterns 155 and the first semiconductor pattern 165 may be two-dimensionally arranged on the top surface of the lower structure 10.

Figure 5:
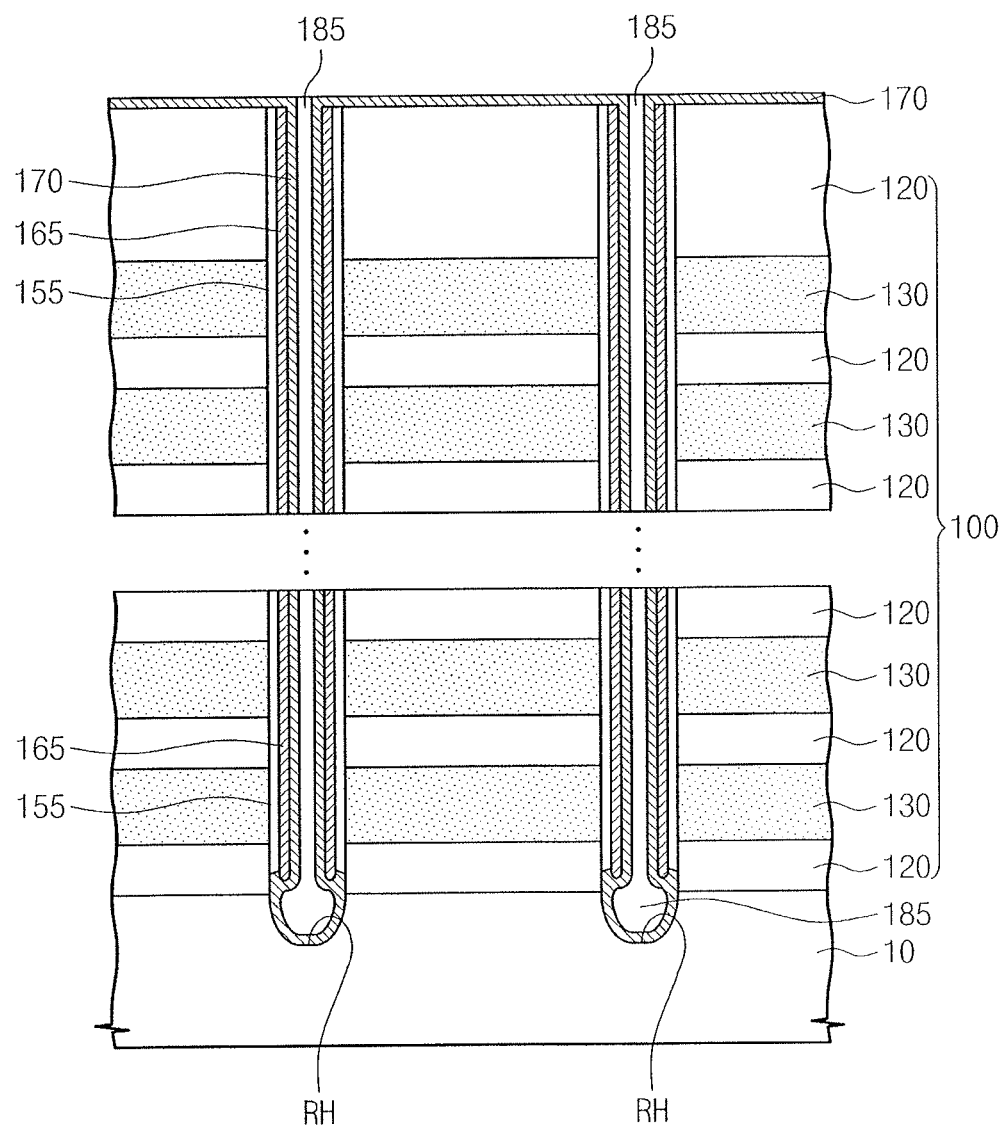

Referring to FIG. 5, a second semiconductor layer 170 and a gap-filling pattern 185 may be sequentially formed on the resultant structure provided with the vertical pattern 155.

The second semiconductor layer 170 may be a semiconductor layer (e.g., a polycrystalline silicon layer) formed using one of, for example, ALD and CVD. In some embodiments, the second semiconductor layer 170 may be conformally formed not to fill completely the opening 105. Since the lower sidewall of the layer stack 100 is partially exposed by the undercut region as described above, the second semiconductor layer 170 may be formed in direct contact with the exposed sidewall of the layer stack 100.

The gap-filling pattern 185 may be formed to fill, e.g., completely fill, the opening 105 provided with the second semiconductor layer 170 and may be an insulating layer formed using spin-on-glass (SOG) technique or a silicon oxide layer. In some embodiments, a hydrogen annealing step for thermally treating the structure including the second semiconductor layer 170 under a gas atmosphere including hydrogen and/or heavy hydrogen may be performed (e.g., before the formation of the gap-filling pattern 185). Crystal defects in the first semiconductor pattern 165 and the second semiconductor layer 170 may be cured and/or reduced during the hydrogen annealing.

Figure 6:
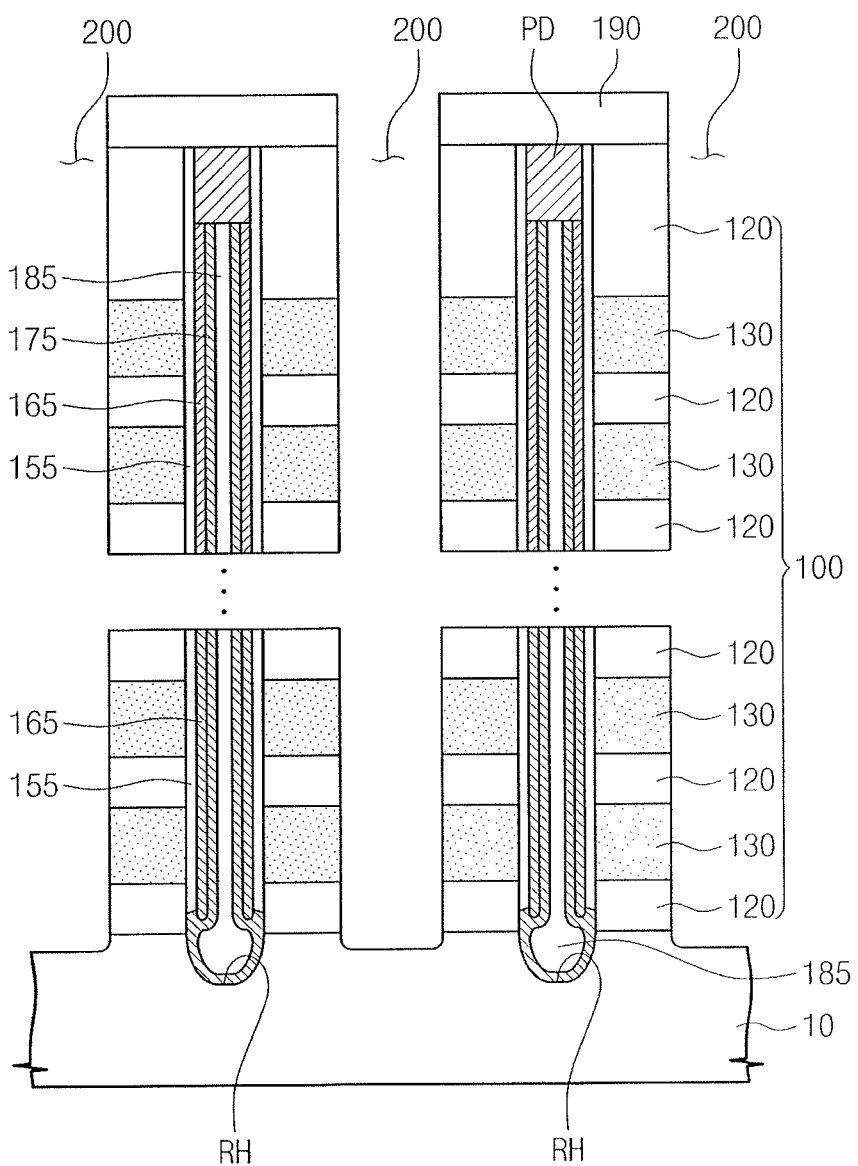

Referring to FIG. 6, trenches 200 may be formed to penetrate the layer stack 100 and expose sidewalls of the sacrificial layers 130 and the interlayer dielectrics 120. The trenches 200 may be spaced apart from the openings 105 and cross between the openings 105.

The formation of the trenches 200 may include forming an etch mask 190 on the layer stack 100, and anisotropically etching the layer stack 100 to expose the top surface of the lower structure 10. As shown, the lower structure 10 under the trench 200 may be recessed by over-etching during the anisotropic etching of the layer stack 100.

In some embodiments, a pair of the trenches 200 may be formed at both sides of each of the openings 105. For instance, the openings 105 disposed between the pair of the trenches 200 may be spaced the substantially same distance apart from one of the trenches 200. But example embodiments of the inventive concepts may not be limited thereto. For example, in the openings 105 disposed between the pair of the trenches 200, some may be different from others in terms of a distance from one of the trenches 200.

In some embodiments, a second semiconductor pattern 175 and a pad PD may be formed before the formation of the etch mask 190. The second semiconductor pattern 175 may be formed by patterning the second semiconductor layer 170 and may be localized within the opening 105. The pad PD may be formed to be connected to the first and second semiconductor patterns 165 and 175. In some embodiments, the formation of the pad PD may include recessing upper portions of the first and second semiconductor patterns 165 and 175 and filling the recessed region with the pad PD. The pad PD may be formed of a semiconductor material having a different conductivity type from the first and second semiconductor patterns 165 and 175. Since the second semiconductor pattern 175 may be formed by patterning the second semiconductor layer 170 as described above, the second semiconductor pattern 175 may be formed in direct contact with the lower sidewall of the layer stack 100 exposed by the undercut region, i.e., as the second semiconductor layer 170.

Figure 7:
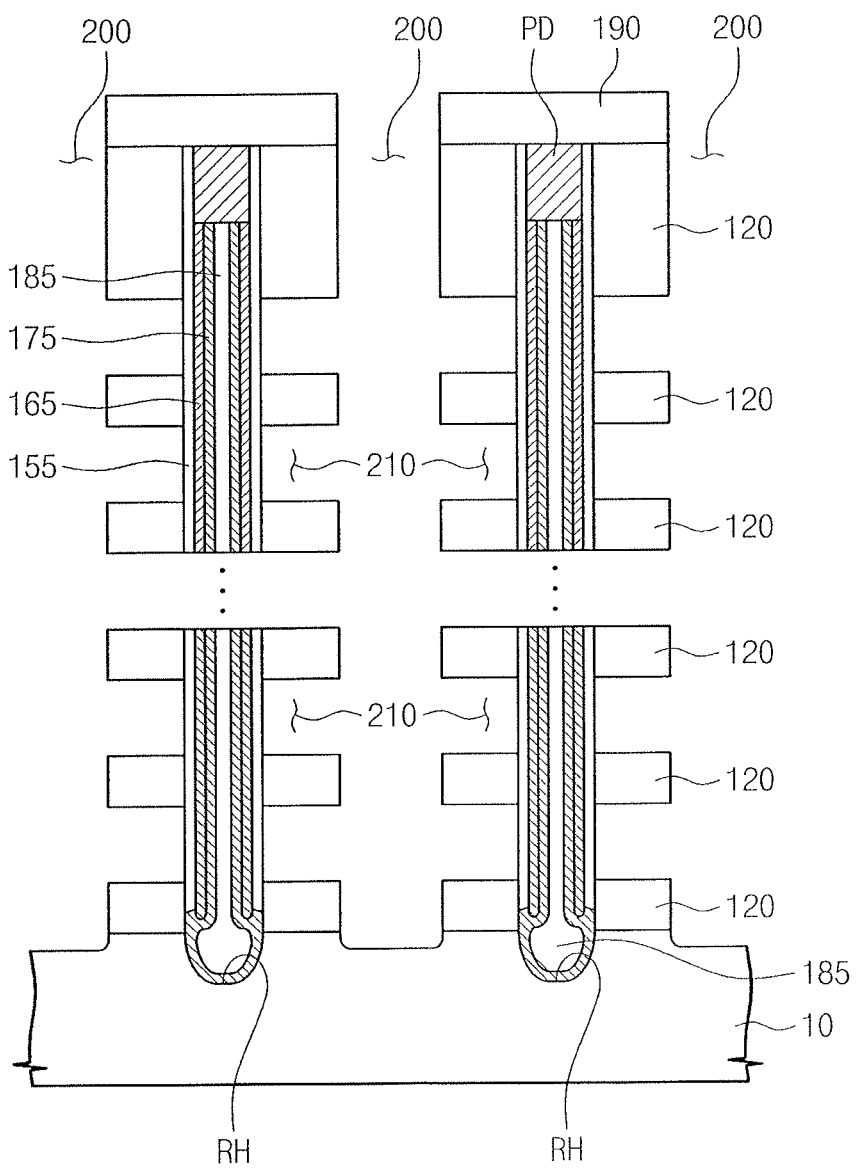

Referring to FIG. 7, recess regions 210 may be formed between the interlayer dielectrics 120 by selectively removing the sacrificial layers 130 exposed by the trench 200. The recess regions 210 may be gap regions extending laterally from the trenches 200, and may be formed to expose the sidewalls of the vertical patterns 155. An outer boundary of the recess region 210 may be defined by the interlayer dielectrics 120 and the trenches 200, and an internal boundary thereof may be defined by the vertical patterns 155 vertically penetrating the recess regions 210.

Formation of the recess regions 210 may include horizontally etching the sacrificial layers 130 using, for example, an etchant and/or etch process with etch selectivity to the interlayer dielectrics 120 and the vertical patterns 155. For example, if the sacrificial layers 130 are silicon nitride layers and the interlayer dielectrics 120 are silicon oxide layers, the horizontal etch may be performed using an etchant including phosphoric acid.

Figure 8:
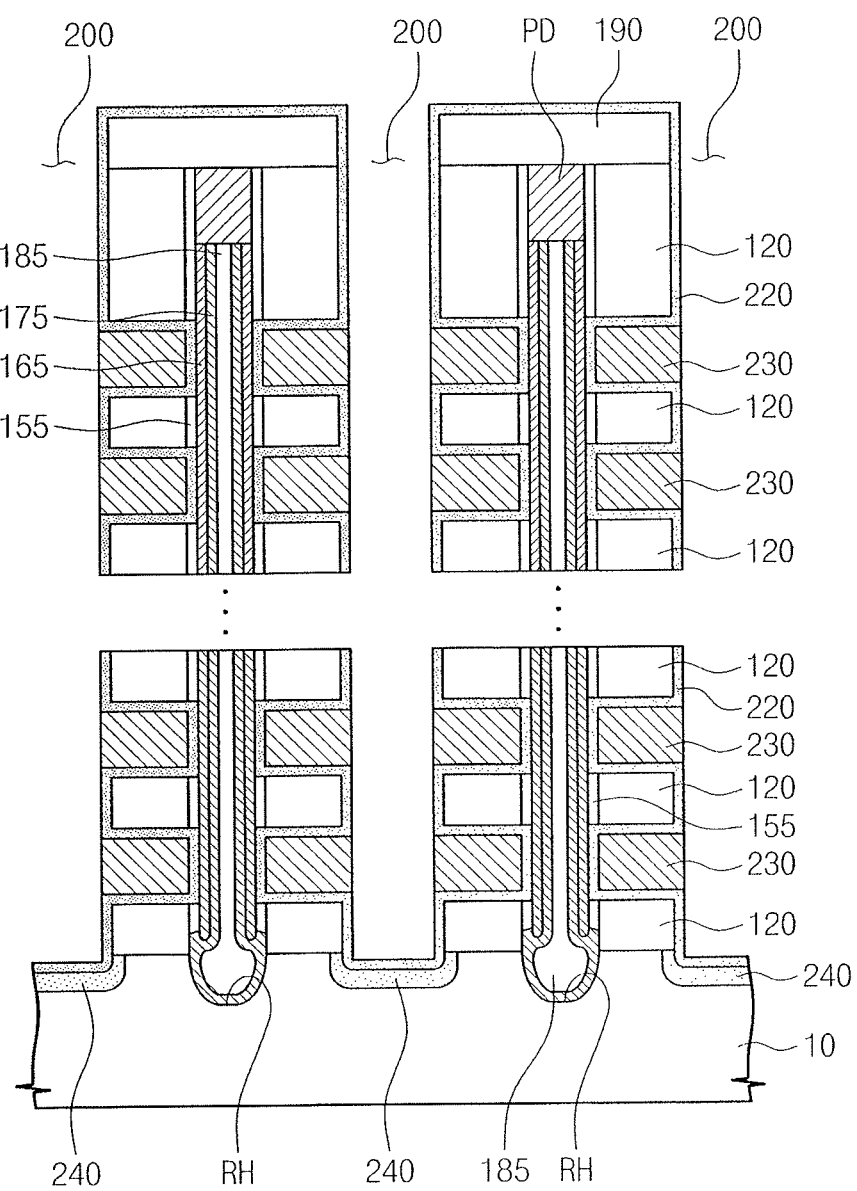

Referring to FIG. 8, an intermediate layer 220 may be formed to cover an inner wall of the recess region 210, e.g., the intermediate layer 220 may conformally coat the resultant structure on the lower structure 10 to trace each recess region 210. Then, conductive patterns 230 may be formed to fill the remaining space of the recess region 210, i.e., on the intermediate layer 220. The formation of the intermediate layer 220 and the conductive patterns 230 may include sequentially forming the intermediate layer 220 and a conductive layer to cover, e.g., and fill, the recess regions 210, and then removing the conductive layer from the trenches 200, so the conductive patterns 230 remain in the recess regions 210.

According to the present embodiments, before the formation of the intermediate layer 220, the vertical pattern 155 exposed by the recess region 210 may be further etched to expose a sidewall of the first semiconductor pattern 165. In this case, the intermediate layer 220 may be in direct contact with the exposed sidewall of the first semiconductor pattern 165, as shown, and the vertical pattern 155 may include a plurality of portions vertically separated by the intermediate layer 220.

The intermediate layer 220 may be formed to have a single- or multi-layered structure, similar to the vertical layer 150. In some embodiments, the intermediate layer 220 may include a blocking insulating layer of the charge trap type nonvolatile memory transistor. In other embodiments, the intermediate layer 220 may further include a charge storing layer and/or a tunnel insulating layer of the charge trap type nonvolatile memory transistor.

The conductive layer (on the intermediate layer 220) may be formed of, for example, at least one of doped silicon, metallic materials, metal nitrides, and/or metal silicide. For example, the conductive layer may be formed of a tantalum nitride layer and/or a tungsten layer.

In some embodiments, the conductive layer may be formed to conformally cover the inner walls of the trench 200, and formation of the conductive pattern 230 may include removing the conductive layer in the trench 200 using, for example, an isotropic etch. In other embodiments, the conductive layer may be formed to fill the trench 200, and formation of the conductive pattern 230 may include, for example, an anisotropic etching of the conductive layer in the trench 200.

According to example embodiments of the inventive concepts with respect to a FLASH memory, doped regions 240 may be formed after the formation of the conductive patterns 230. The doped regions 240 may be formed through an ion implantation process, and may be formed in the lower structure 10 exposed through the trench 200.

The doped regions 240 may be formed to have a different conductivity type from the first and second semiconductor patterns 165 and 175. As a result, the doped region 240 may form a pn junction in conjunction with the lower structure 10 and/or the second semiconductor layer 170. In other embodiments, a region of the lower structure 10 in contact, e.g., direct contact, with the second semiconductor pattern 175 (hereinafter, a contact region) may have the same conductivity type as the second semiconductor pattern 175.

In some embodiments, the doped regions 240 may be connected to each other and may be in an equipotential state. In other embodiments, the doped regions 240 may be electrically separated from each other. In still other embodiments, the doped regions 240 may be classified into a plurality of source groups, each of which include at least one doped region, and the source groups may be electrically separated from each other to be at different electric potentials.

Figure 9:
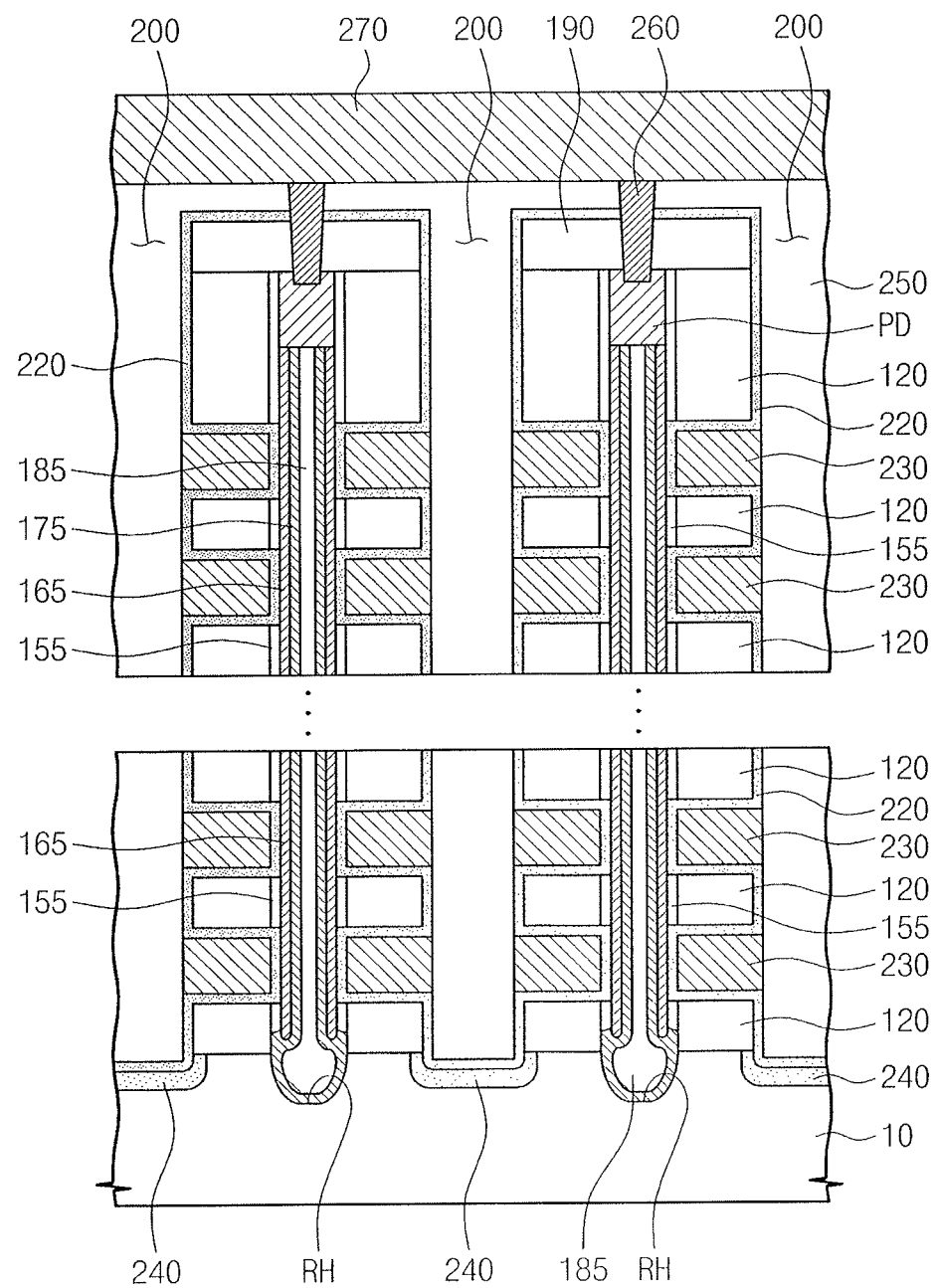

Referring to FIG. 9, electrode separation patterns 250 may be formed to fill the trenches 200, upper plugs 260 may be formed to be connected to the pads PD, respectively, and then upper interconnection lines 270 may be formed to connect the upper plugs 260. The electrode separation pattern 250 may be formed of at least one of silicon oxide, silicon nitride, or silicon oxynitride. The upper plugs 260 may be formed of at least one of doped silicon or metallic materials.

Each of the upper interconnection lines 270 may be electrically connected to the first and second semiconductor patterns 165 and 175 via the upper plug 260 and may be formed to cross the conductive patterns 230 or the trenches 200. According to example embodiments of a NAND FLASH memory device, the upper interconnection lines 270 may be used as bit lines coupled to upper portions of a plurality of cell strings.

[Modifications of the First Example Embodiments]

Figure 10:
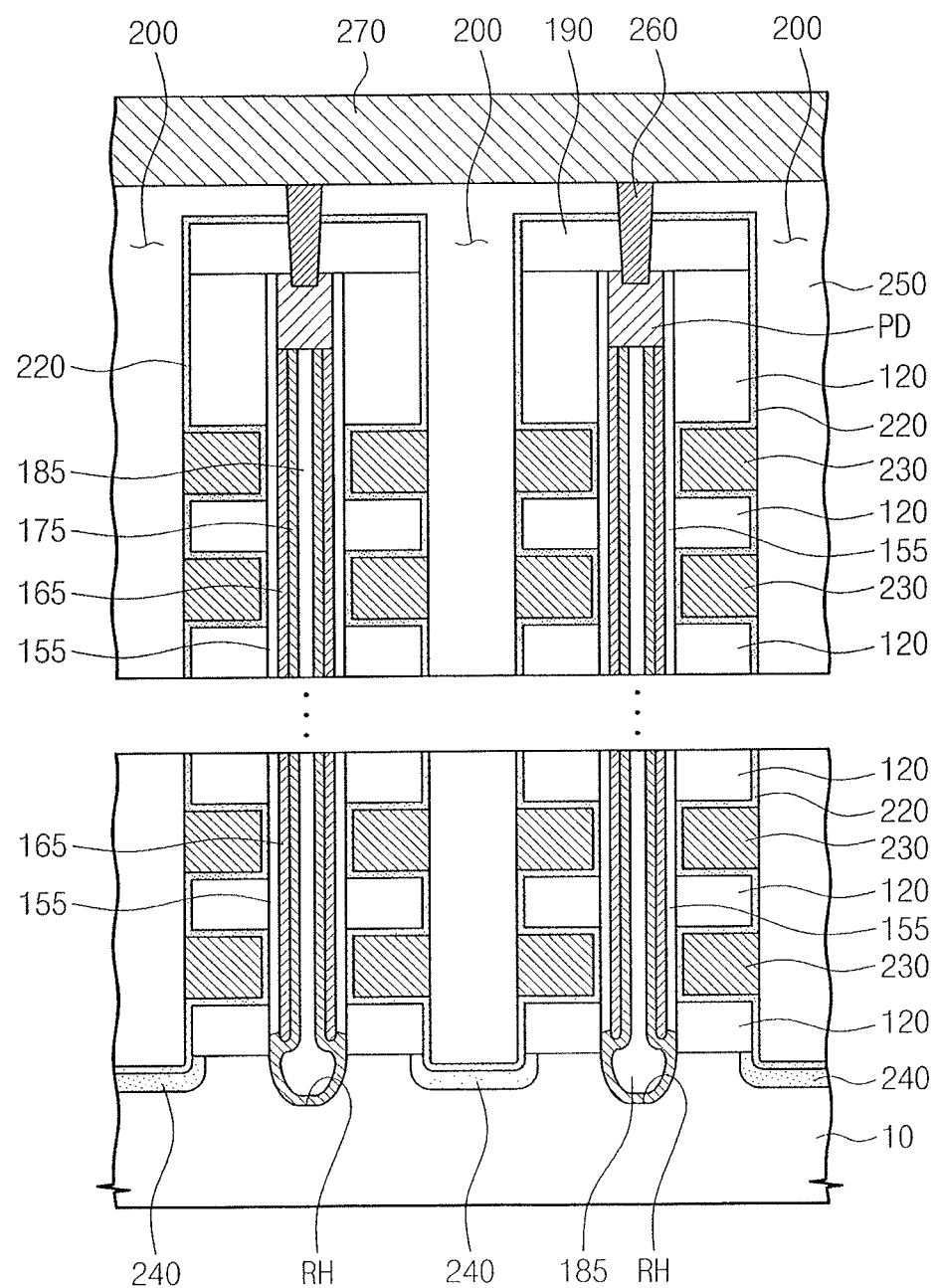
FIG. 10 illustrates a sectional view of methods of fabricating a three-dimensional semiconductor device according to modifications of the first example embodiment.

FIG. 10 is a sectional view illustrating methods of fabricating a three-dimensional semiconductor device according to modifications of the first example embodiment. For concise description, overlapping description of elements previously described with reference to FIGS. 1 through 9 may be omitted.

Referring to FIG. 10, according to the present embodiments, the intermediate layer 220 may be formed to cover the exposed sidewall of the vertical pattern 155, unlike the embodiments previously described with reference to FIG. 8. That is, the step of removing a portion of the vertical pattern 155 exposed by the recess region 210 may be omitted. In this case, as shown, the vertical pattern 155 may remain between the intermediate layer 220 and the first semiconductor pattern 165.

According to example embodiments for realizing a memory device, the intermediate layer 220 and the vertical pattern 155 may include a structure for storing information (hereinafter, a memory layer), as shown in FIGS. 11 through 14. For example, according to example embodiments of a charge trap type nonvolatile memory device, the intermediate layer 220 and the vertical pattern 155 may be part of a memory layer of a memory cell transistor. The number and materials of layers in each of the intermediate layer 220 and the vertical pattern 155 may vary, and based on this diversity, example embodiments of the inventive concepts may be classified into several example embodiments. For example, example embodiments of the inventive concepts related to the memory layer may be classified as in the following Table 1.

TABLE 1

Figure 11:
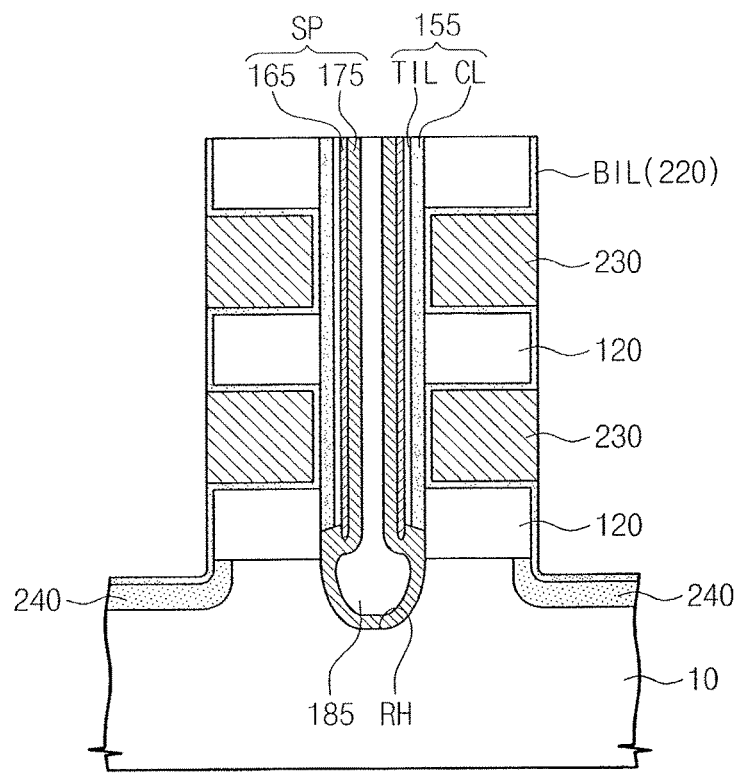
FIGS. 11 through 14 illustrate sectional views of three-dimensional semiconductor devices fabricated by a method based on the modifications of the first example embodiment.
Figure 12:
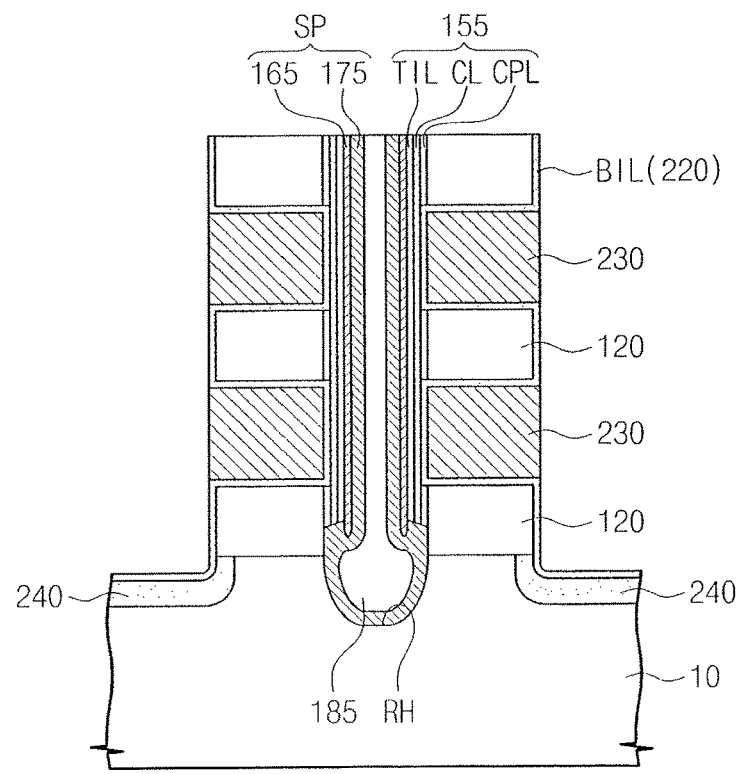
Figure 13:
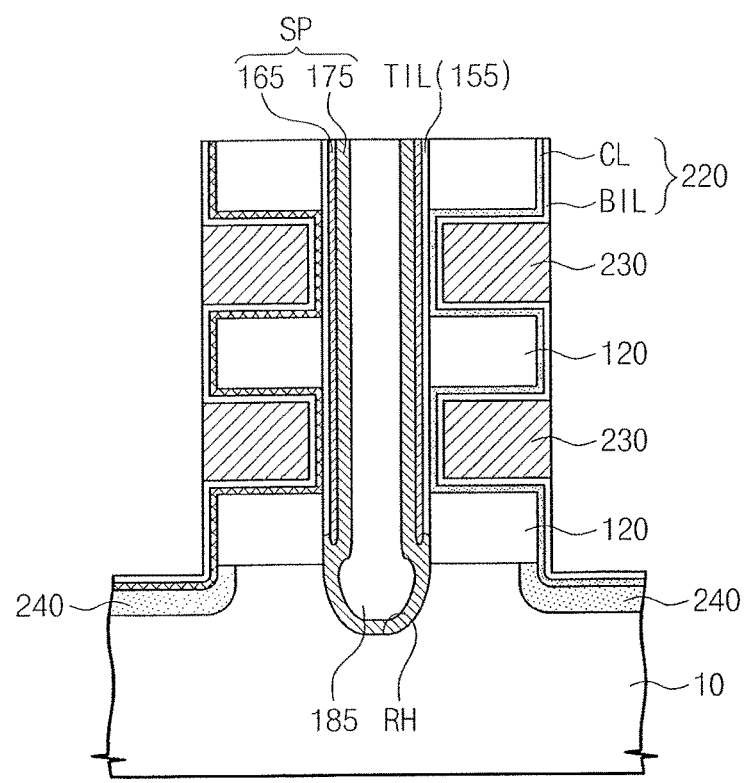
Figure 14:
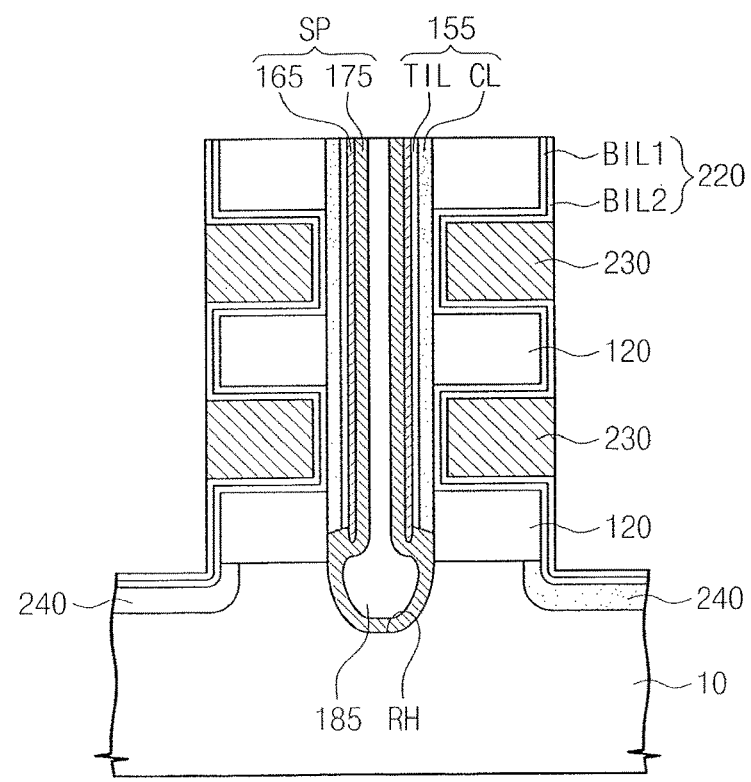

| Memory layer | | | | | | Related Figure |
|---|---|---|---|---|---|---|
| Vertical Pattern | | | Intermediate Layer | | | |
| TIL | CL | CPL | BIL | | | FIG. 12 |
| TIL | CL | | BIL | | | FIG. 11 |
| TIL | | | CL | BIL | | FIG. 13 |
| TIL | CL | CPL | BIL1 | BIL2 | | |
| TIL | CL | | BIL1 | BIL2 | | FIG. 14 |
| TIL | | | CL | BIL1 | BIL2 | |

TIL: tunnel insulating layer
BIL: blocking insulating layer
CL: charge storing layer
CPL: capping layer As shown in Table 1, the memory layer may include a tunnel insulating layer TIL, a charge storing layer CL, and a blocking insulating layer BIL. Layers of the memory layer may be formed using a deposition technique providing, for example, excellent and/or improved step coverage property (e.g., a CVD and/or ALD technique).

In some embodiments, the charge storing layer CL may be used as part of the vertical pattern 155, but in other embodiments the charge storing layer CL may be used as part of the intermediate layer 220. Furthermore, the memory layer may further include a capping layer CPL that is interposed between the charge storing layer CL and the blocking insulating layer BIL and is used as part of the vertical pattern 155.

In some embodiments, each of the tunnel insulating layer TIL, the charge storing layer CL, and the blocking insulating layer BIL may be formed by a single deposition process, thereby having a single-layered structure. In other embodiments, at least one of them may be formed by a plurality of separated layer-forming processes, thereby having a multi-layered structure. For example, as shown in Table 1, the blocking insulating layer BIL may include a first blocking insulating layer BIL1 and a second blocking insulating layer BIL2.

The charge storing layer CL may be one or more insulating layers with abundant trap sites and/or one or more insulating layers with nano particles. For example, the charge storing layer CL may include one of a trap insulating layer or an insulating layer with a floating gate electrode or conductive nano dots. In some embodiments, the charge storing layer CL may include a silicon nitride layer, a silicon oxynitride layer, a silicon-rich nitride layer, a nano crystalline silicon layer, and/or a laminated trap layer.

The tunnel insulating layer TIL may be one of materials with a higher band gap than the charge storing layer CL. For example, the tunnel insulating layer TIL may be a silicon oxide layer. The tunnel insulating layer TIL may undergo a thermal treatment performed after a deposition process. The thermal treatment process may be, for example, a rapid thermal nitridation (RTN) process and/or an annealing process in an atmosphere including nitrogen and/or oxygen.

The blocking insulating layer BIL may include at least one of materials having a band gap smaller than the tunnel insulating layer TIL and higher than the charge storing layer CL. For example, the blocking insulating layer BIL may include one of high-k dielectrics, such as aluminum oxide and hafnium oxide. As a result, the blocking insulating layer BIL may have a dielectric constant higher than the tunnel insulating layer TIL.

In the case that the blocking insulating layer BIL includes the first and second blocking insulating layers BIL1 and BIL2, the first and second blocking insulating layers BIL1 and BIL2 may be different materials. One of the first and second blocking insulating layers BIL1 and BIL2 may be one of materials having a band gap smaller than the tunnel insulating layer TIL and higher than the charge storing layer CL and having a dielectric constant greater than the other. For example, one of the first and second blocking insulating layers BIL1 and BIL2 may be formed of high-k dielectrics, such as aluminum oxide and hafnium oxide, and the other may be formed of silicon oxide. In this case, the blocking insulating layer BIL including the first and second blocking insulating layers BIL1 and BIL2 may have an effective dielectric constant greater than the tunnel insulating layer TIL.

The capping layer CPL may be formed of a material providing an etch selectivity with respect to the charge storing layer CL and/or the sacrificial layer 130. For example, if the sacrificial layer 130 is a silicon nitride layer, the capping layer CPL may be a silicon oxide layer or an aluminum oxide layer. During a process for removing the sacrificial layer 130 to form the recess regions 210, the capping layer CPL may serve as an etch stop layer preventing and/or reducing etch damage of the charge storing layer CL.

In the case that the capping layer CPL may remain between the conductive pattern 230 and the charge storing layer CL, the capping layer CPL may be a material contributing to preventing leakage (e.g., back-tunneling) of electric charges stored in the charge storing layer CL. For example, the capping layer CPL may be one of a silicon oxide layer and a high-k dielectric layer.

[Second Example Embodiments and Modifications Thereof]

Figure 15:
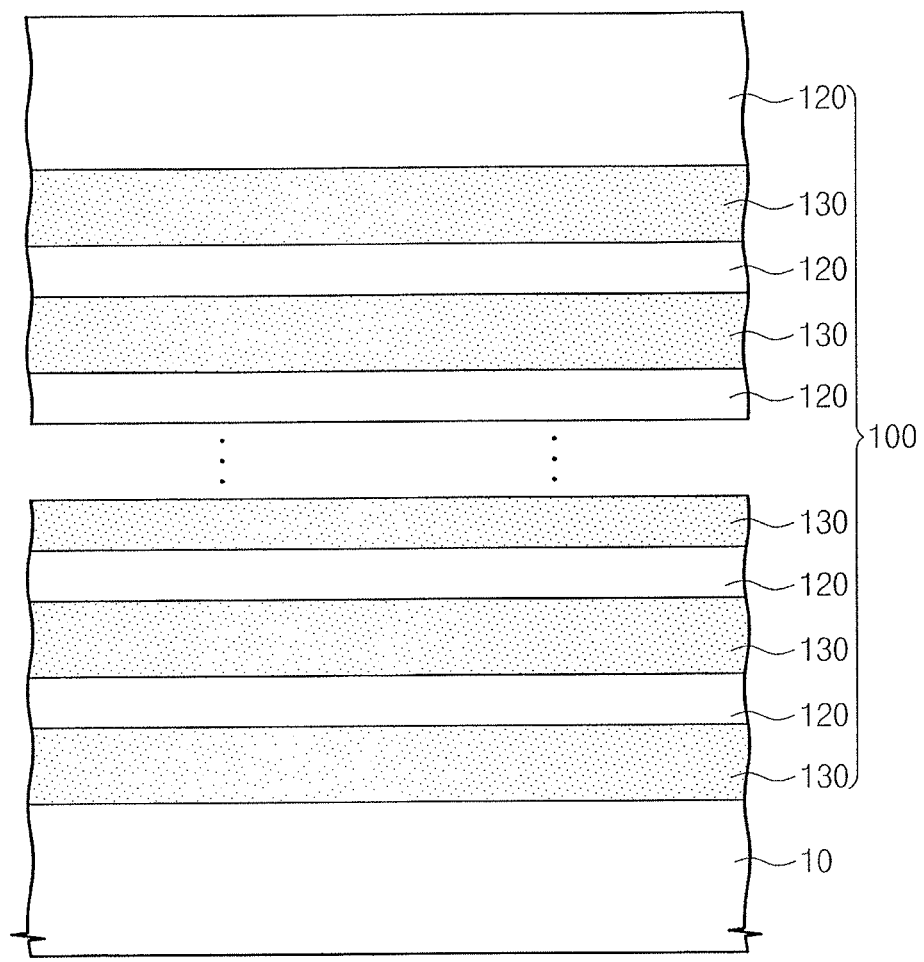
FIGS. 15 through 17 illustrate sectional views of stages in methods of fabricating a three-dimensional semiconductor device according to a second example embodiment.
Figure 16:
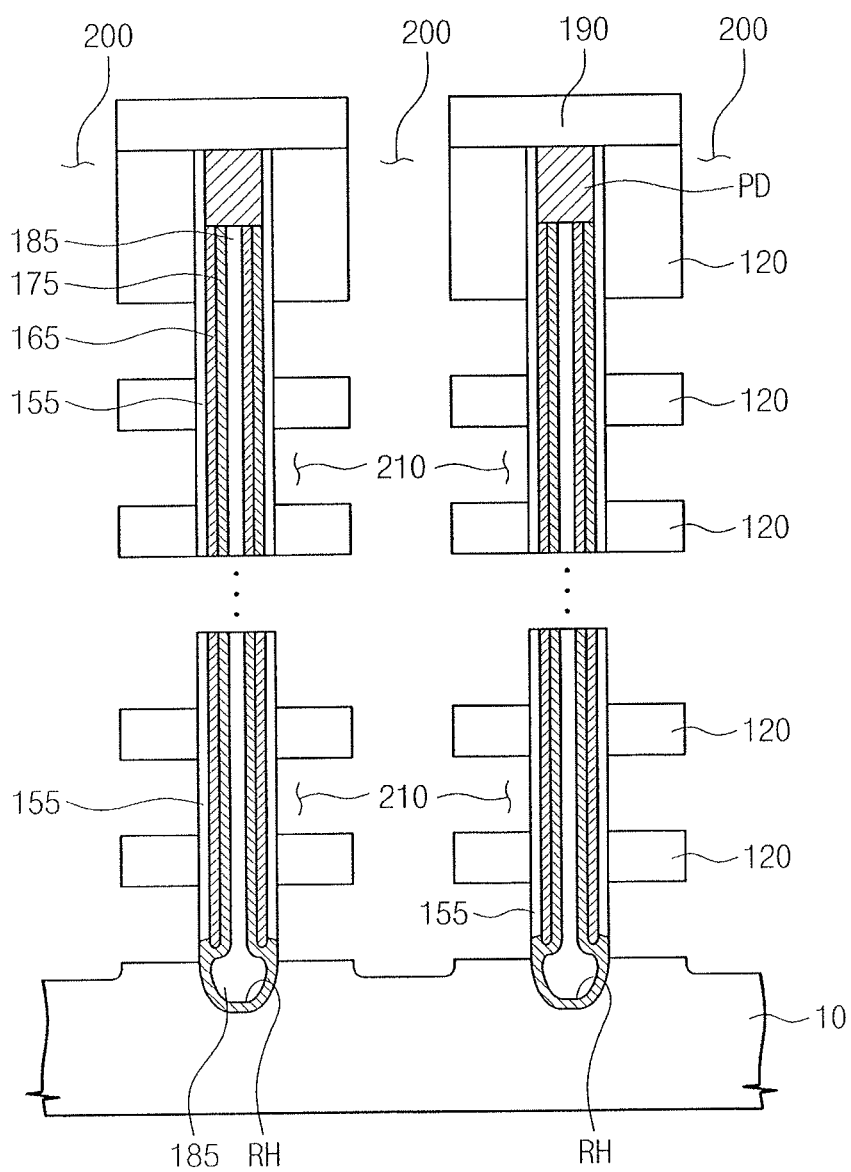
Figure 17:
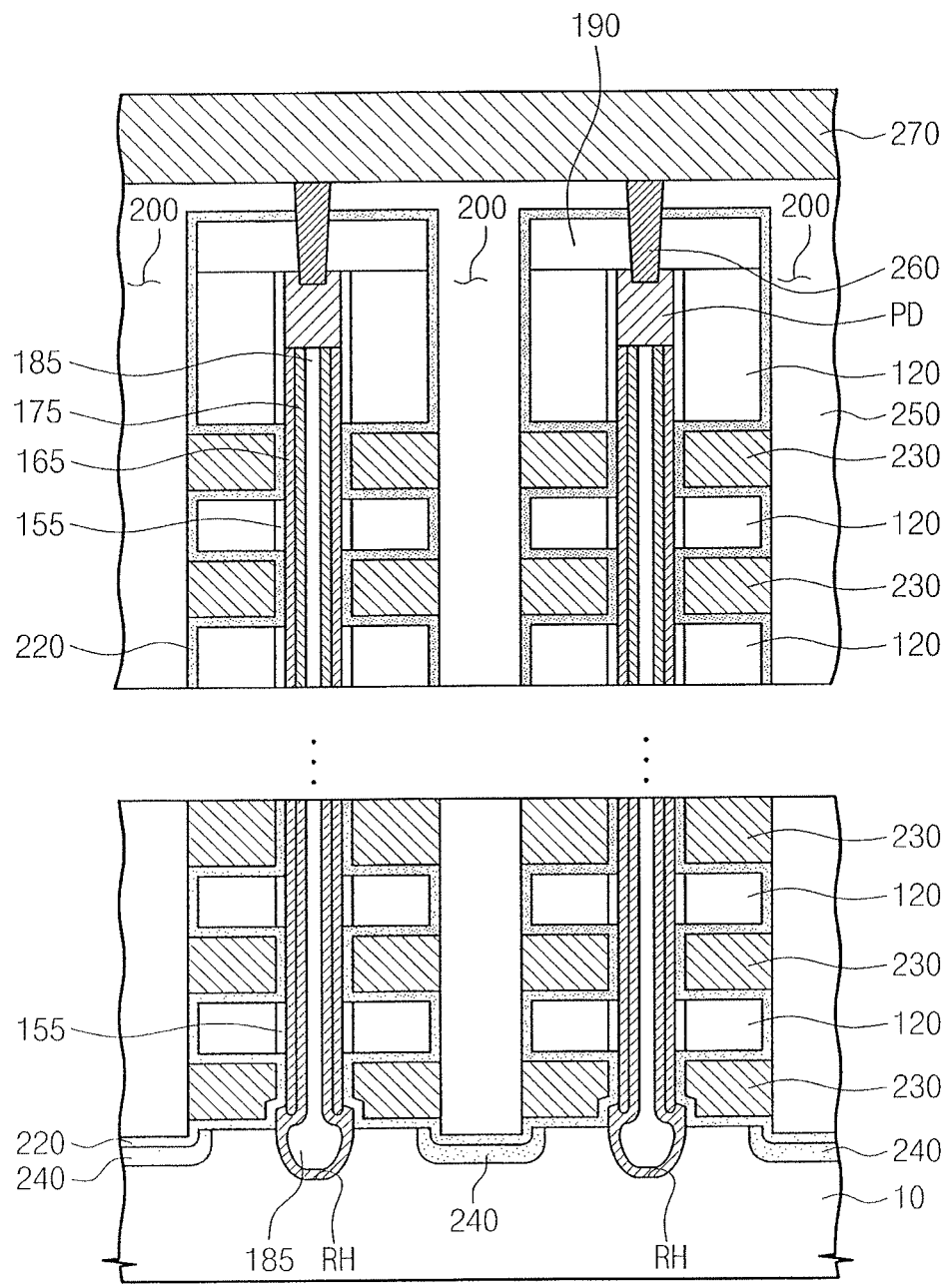
Figure 18:
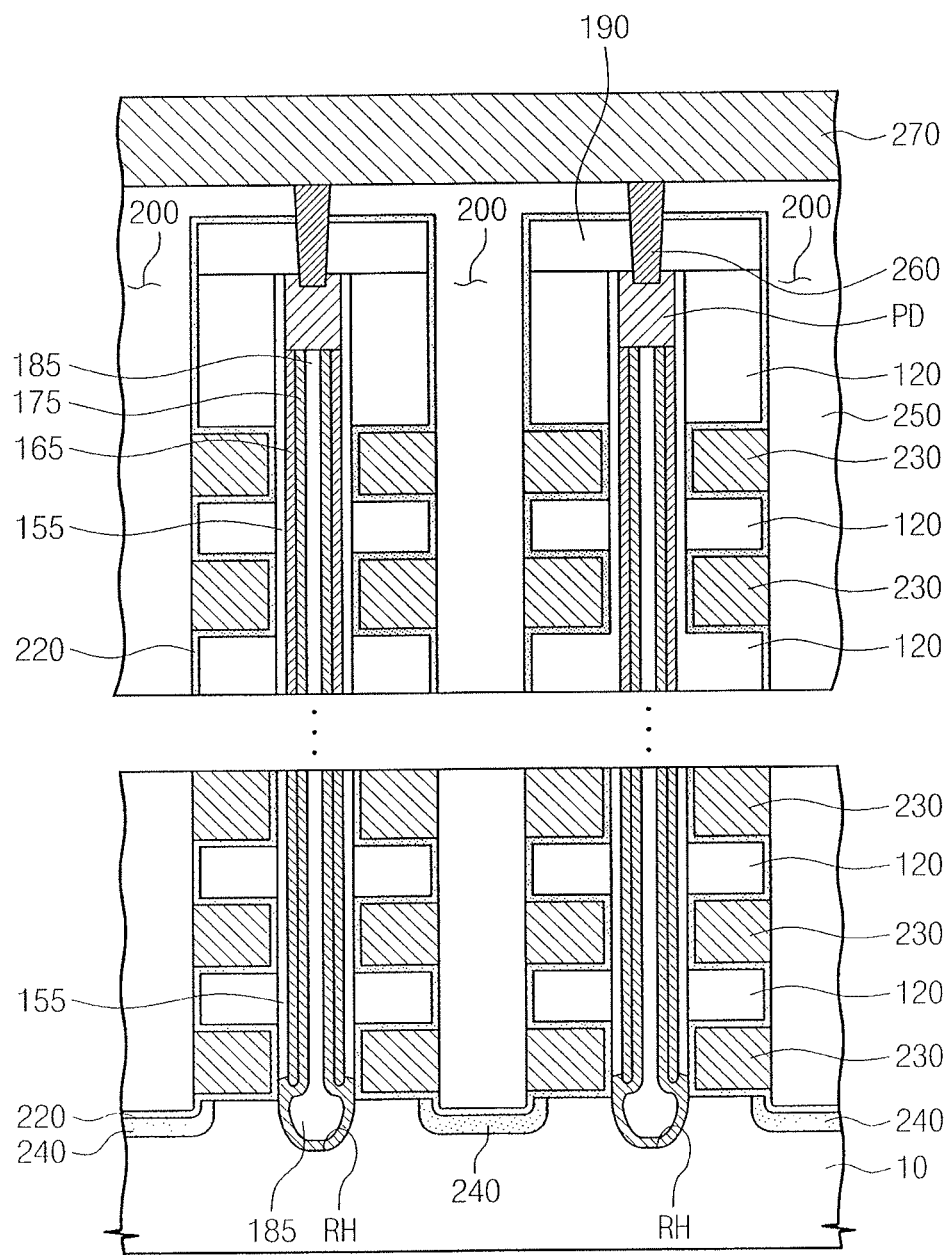
FIG. 18 illustrates a sectional view of a method of fabricating a three-dimensional semiconductor device according to modifications of the second example embodiment.

FIGS. 15 through 17 are sectional views illustrating methods of fabricating a three-dimensional semiconductor device according to a second example embodiment. FIG. 18 is a sectional view illustrating methods of fabricating a three-dimensional semiconductor device according to modifications of the second example embodiment. For concise description, overlapping description of elements previously described with reference to FIGS. 1 through 14 may be omitted.

According to the present embodiments, as shown in FIG. 15, the sacrificial layer 130 may be the lowermost layer of the layer stack 100, i.e., the sacrificial layer 130 may be directly on the lower structure 10. In this case, as shown in FIG. 16, the recess region 210 may be formed to expose the top surface of the lower structure 10 around the second semiconductor pattern 175. Therefore, the intermediate layer 220 may be solely interposed between the conductive pattern 230 and the lower structure 10, as shown in FIGS. 17 and 18. That is, a portion of the intermediate layer 220 may be directly between a lowermost conductive pattern 230 and the lower structure 10.

In some embodiments, as described previously with reference to FIG. 8, before the formation of the intermediate layer 220, the vertical pattern 155 exposed by the recess region 210 may be additionally etched to expose the sidewall of the first semiconductor pattern 165. In this case, the intermediate layer 220 may be formed in direct contact with the exposed sidewall of the first semiconductor pattern 165, as shown in FIG. 17, and the vertical pattern 155 may include a plurality of portions vertically separated by the intermediate layer 220.

In other embodiments, as described previously with reference to FIG. 10, the additional etching of the vertical pattern 155 may be omitted. That is, the intermediate layer 220 may be formed to cover the sidewall of the vertical pattern 155. In this case, as shown in FIG. 18, the vertical pattern 155 may remain between the intermediate layer 220 and the first semiconductor pattern 165 and may serve as the memory layer along with the intermediate layer 220.

As described previously, the second semiconductor pattern 175 may be formed in direct contact with the lower sidewall of the layer stack 100 exposed by the undercut region. Accordingly, the lowermost of the recess regions 210 may be formed to partially expose the sidewall of the second semiconductor pattern 175, as shown in FIG. 16. Therefore, the intermediate layer 220 may be in direct contact with the exposed sidewall of the second semiconductor pattern 175 in the lowermost recess region 210, as shown in FIG. 17.

In modified embodiments, the sacrificial layer 130 and the lower structure 10 may be formed of materials, whose thermal expansion coefficients are highly different from each other. In order to avoid technical problems related to the difference in the thermal expansion coefficients, a buffer layer (not shown) may be interposed between the layer stack 100 and the lower structure 10. In some embodiments, the buffer layer may be thinner than the sacrificial layer 130. For example, if the sacrificial layer 130 is a silicon nitride layer and the lower structure 10 is a silicon wafer, the buffer layer may be a silicon oxide layer, e.g., formed by oxidizing the silicon wafer.

In order to reduce complexity in the drawings, a portion of a three-dimensional semiconductor device spaced apart from the lower structure 10 (for instance, the upper interconnection lines 270) will be omitted in FIGS. 19 through 49. Those of ordinary skill in the art with knowledge of example embodiments will understand which elements may be omitted from both the accompanying drawings and descriptions of fabricating methods. Additionally, for concise description, description of overlapping elements previously described may be omitted. Since three-dimensional semiconductor devices described herein may be fabricated through modifications of the above-mentioned fabricating methods and other different fabricating methods, all the described elements of disclosed fabricating method may not necessarily be explicitly included in description of three-dimensional semiconductor devices.

[Third Example Embodiments and Modifications Thereof]

Figure 23:
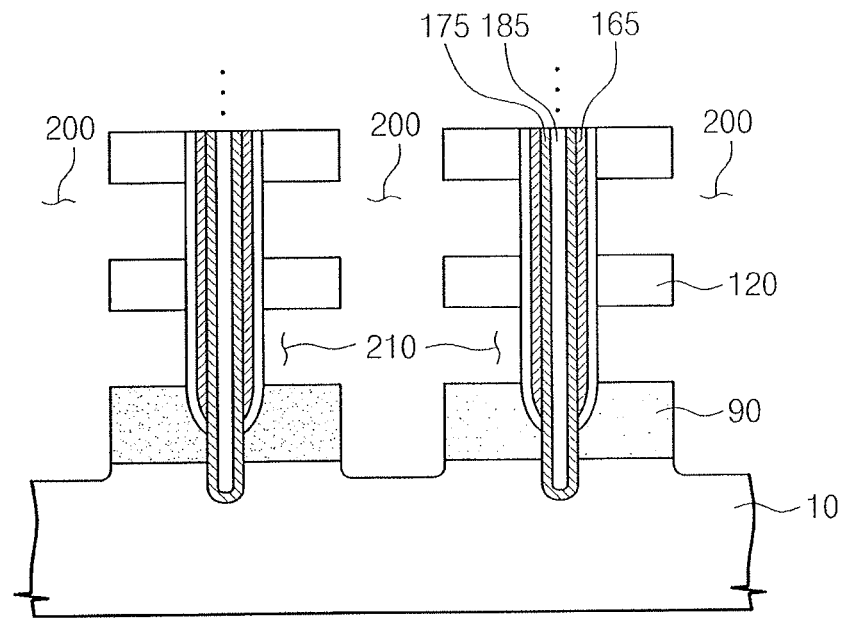
Figure 24:
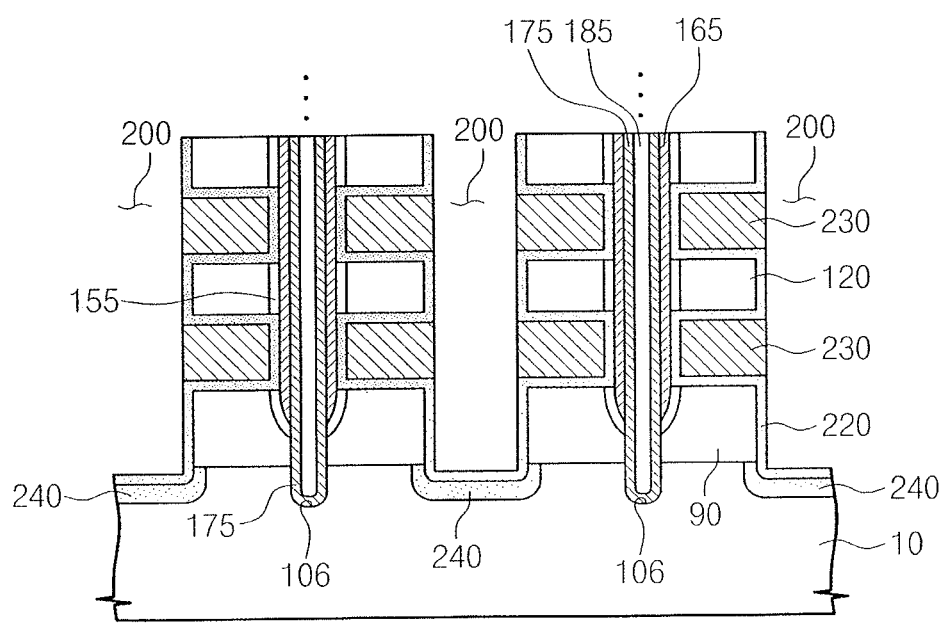
Figure 25:
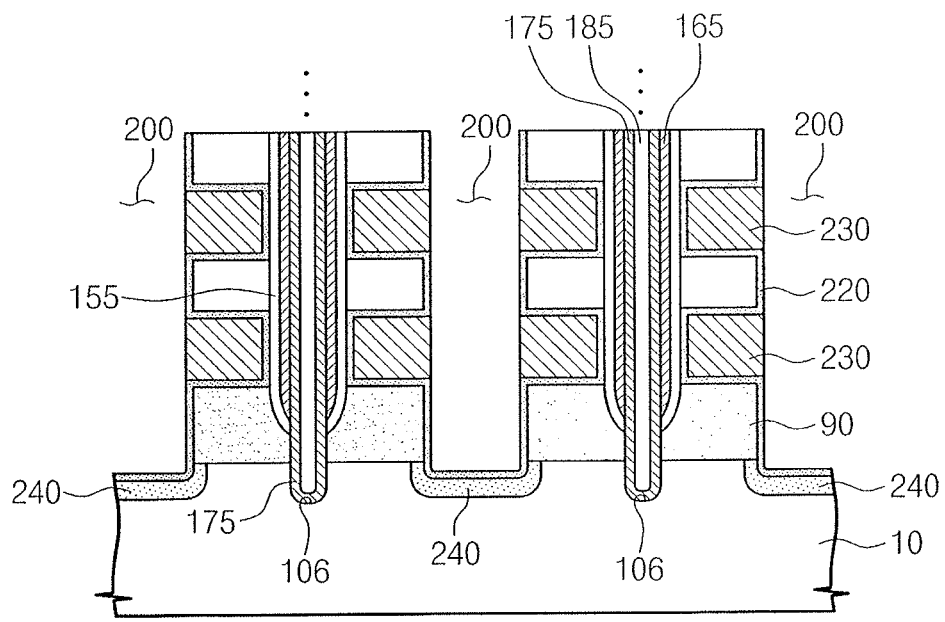
FIGS. 25 through 28 illustrate sectional views of stages in methods of fabricating a three-dimensional semiconductor device according to first and second modifications of the third example embodiment.

FIGS. 19 through 24 are sectional views illustrating methods of fabricating a three-dimensional semiconductor device according to a third example embodiment. FIG. 25 is a sectional view of methods of fabricating a three-dimensional semiconductor device according to a first modification of the third example embodiment. For concise description, overlapping description of elements previously described with reference to FIGS. 1 through 18 may be omitted.

Figure 19:
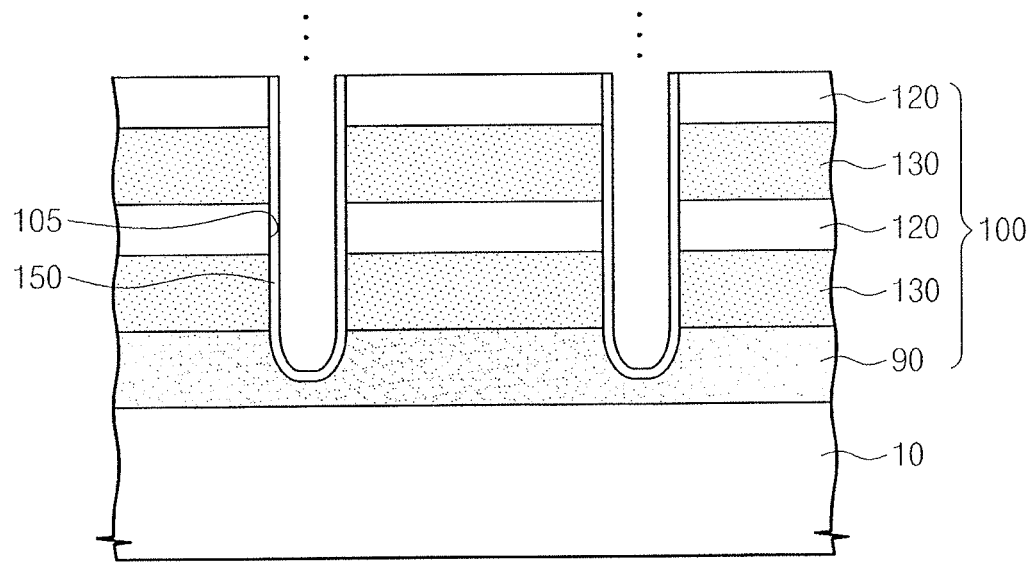
FIGS. 19 through 24 illustrate sectional views of stages in methods of fabricating a three-dimensional semiconductor device according to a third example embodiment.

According to the present embodiments, as shown in FIG. 19, the layer stack 100 may further include an underlying layer 90, and the opening 105 may be formed to have a bottom surface positioned in the underlying layer 90. That is, a bottom of the opening 105 may be in the underlying layer 90, e.g., the opening 105 may not contact the lower structure 10.

The underlying layer 90 may be formed of an insulating material having an etch selectivity with respect to at least one of the interlayer dielectric 120 or the sacrificial layer 130. For example, the underlying layer 90 may be an etch selectivity of silicon oxide, silicon nitride, a metal oxide, or a metal nitride. In some embodiments, the underlying layer 90 may include a high-k dielectric, e.g., aluminum oxide and/or hafnium oxide. In other embodiments, in the case that a layer of the layer stack 100 formed directly on the underlying layer 90 is a silicon oxide layer, the underlying layer 90 may include at least one of silicon nitride or aluminum oxide. In still other embodiments, in the case that a layer of the layer stack 100 formed directly on the underlying layer 90 is a silicon nitride layer, the underlying layer 90 may include at least one of silicon oxide or aluminum oxide.

The formation of the opening 105 may include anisotropically etching the interlayer dielectric 120 and the sacrificial layer 130 using an etch recipe providing an etch selectivity with respect to the underlying layer 90. That is, the underlying layer 90 may serve as an etch stop layer during the formation of the opening 105. As a result, the bottom surface of the opening 105 may be formed at a level vertically spaced apart from the lower structure 10. That is, a portion of the underlying layer 90 may remain between the opening 105 and the lower structure 10.

Figure 20:
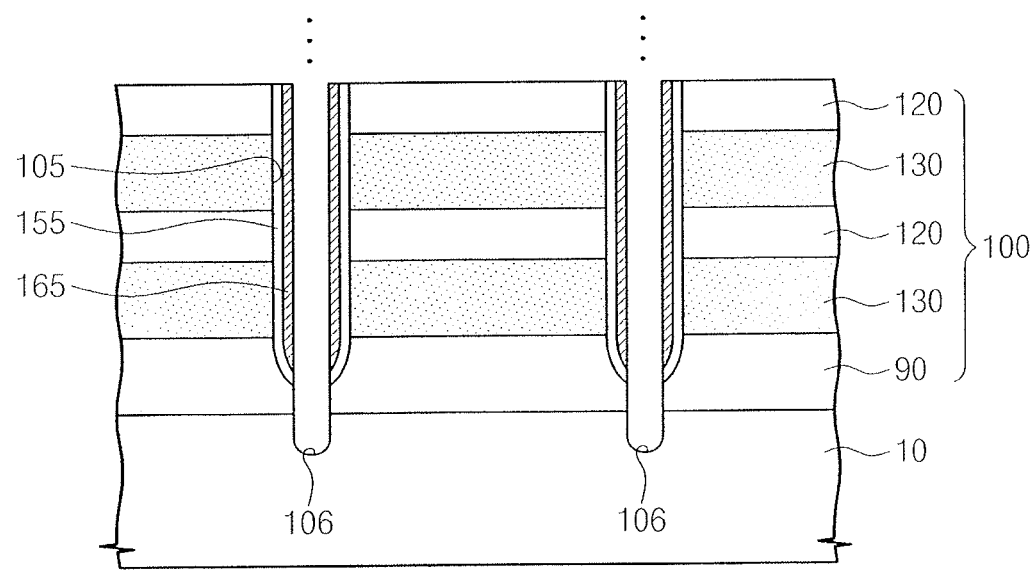

Thereafter, the vertical layer 150 may be formed to cover the inner wall of the opening 105, as shown in FIG. 19, and then a through hole 106 may be formed to penetrate a portion of the underlying layer 90 remaining below the opening 105, as shown in FIG. 20. During the formation of the through hole 106, the top surface of the lower structure 10 may be recessed below the opening 105. The formation of the through hole 106 may include forming a first semiconductor layer to cover an inner wall of the vertical layer 150 and then anisotropically etching the first semiconductor layer, the vertical layer 150, and the remaining portion of the underlying layer 90 to expose the lower structure 10.

Accordingly, the vertical pattern 155 and the first semiconductor pattern 165 may be localized within a region, which is included in the opening 105 but not in the through hole 106. For instance, the vertical pattern 155 may be formed to have a spacer shape covering the inner wall of the opening 105, and a bottom surface thereof may be positioned at a level equivalent to or higher than the top surface of the lower structure 10.

Figure 21:
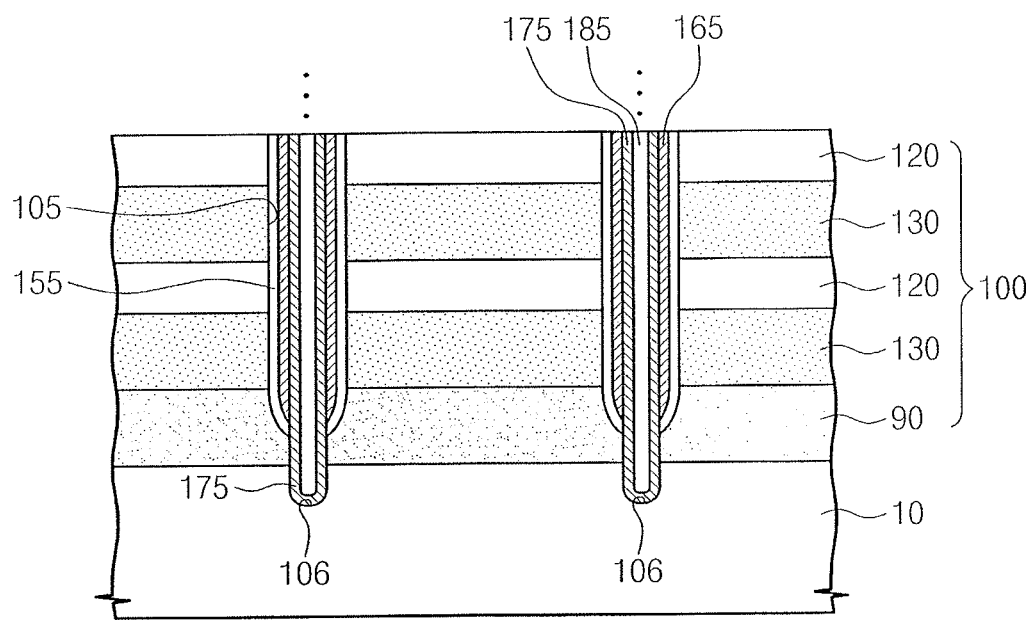

As shown in FIG. 21, the through hole 106 may be filled with the second semiconductor pattern 175 and the gap-filling pattern 185. Since the bottom surface of the vertical pattern 155 may be positioned at a level equivalent to or higher than the top surface of the lower structure 10, as described above, the step of additionally etching the lower region of the vertical pattern 155, which was described with reference to FIG. 4, may be omitted. For all that, similar to the previously described embodiments, the second semiconductor pattern 175 may be formed in direct contact with the lower sidewall of the layer stack 100. However, it is optional whether the additional etching step would be omitted or not, and the additional etching step may be still performed in the present embodiments.

Figure 22:
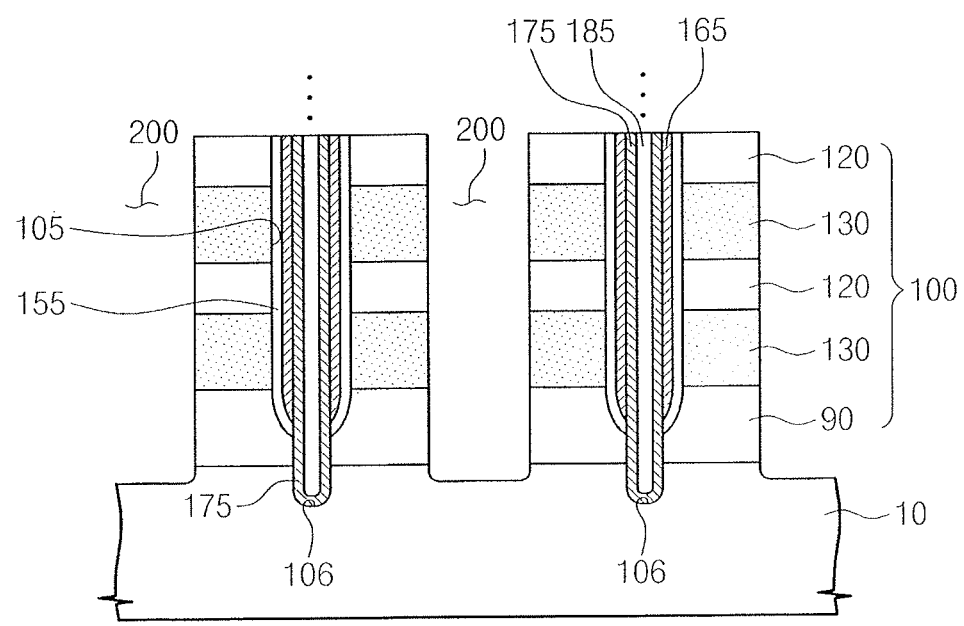

Thereafter, as shown in FIG. 22, the trenches 200 may be formed spaced apart from the first semiconductor patterns 165 to penetrate the layer stack 100, and then, as shown in FIG. 23, the sacrificial layers 130 may be selectively removed to form the recess regions 210 exposing the sidewall of the vertical pattern 155. These steps may be performed by using or modifying the method described with reference to FIGS. 6 and 7. In the meantime, since the interlayer dielectric 120 or the sacrificial layer 130 is formed to have the etch selectivity with respect to the underlying layer 90, a sidewall profile of the trench 200 may be changed from that shown in FIG. 22. For concise description, description on such a variation related to the sidewall profile of the trench 200, which can be easily expected by those of ordinary skill in the art, may be omitted.

According to the third embodiments of the inventive concepts, as described with reference to FIG. 8, before the formation of the intermediate layer 220, the vertical pattern 155 exposed by the recess region 210 may be further etched to expose the sidewall of the first semiconductor pattern 165. In this case, the intermediate layer 220 may be in direct contact with the exposed sidewall of the first semiconductor pattern 165, as shown in FIG. 24, and the vertical pattern 155 may include a plurality of portions vertically separated by the intermediate layer 220.

In other embodiments, as described previously with reference to FIG. 10, the additional etching of the vertical pattern 155 may be omitted. That is, the intermediate layer 220 may be formed to cover the sidewall of the vertical pattern 155. In this case, as shown in FIG. 25, the vertical pattern 155 may remain between the intermediate layer 220 and the first semiconductor pattern 165 and may serve as the memory layer along with the intermediate layer 220.

According to the present embodiments, as shown in FIG. 23, the recess regions 210 may be formed spaced apart from the second semiconductor pattern 175. And, as shown in FIGS. 24 and 25, the underlying layer 90 may be interposed between the intermediate layer 220 and the lower structure 10, and the second semiconductor pattern 175 may be formed in direct contact with the lower sidewall of the underlying layer 90.

Figure 26:
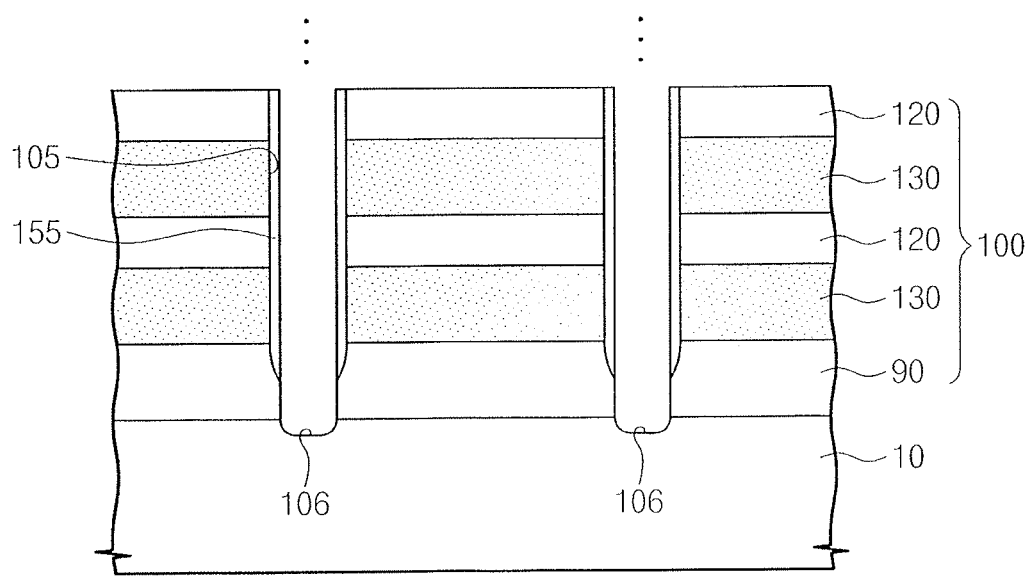
Figure 27:
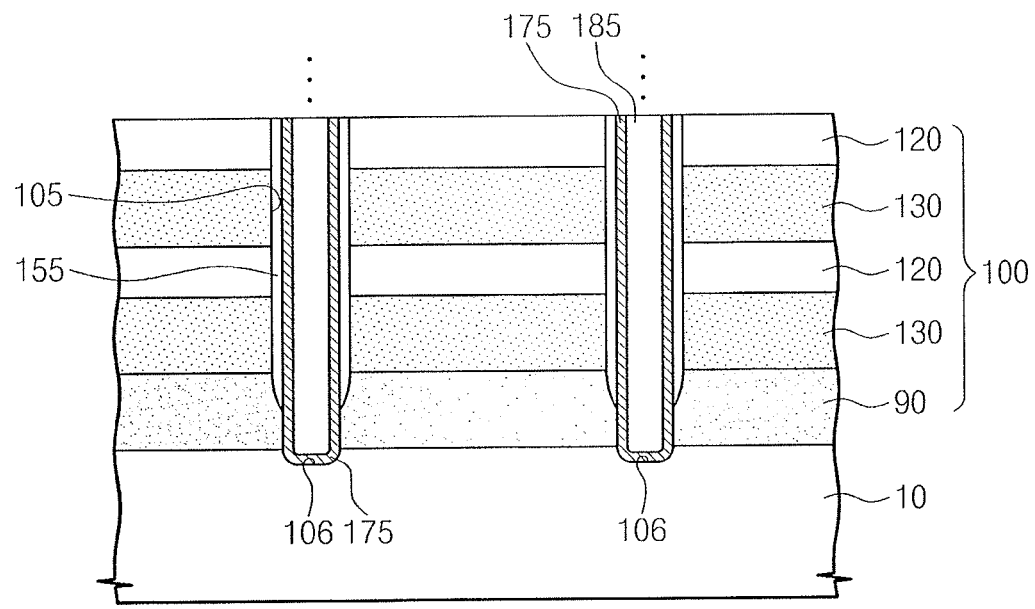
Figure 28:
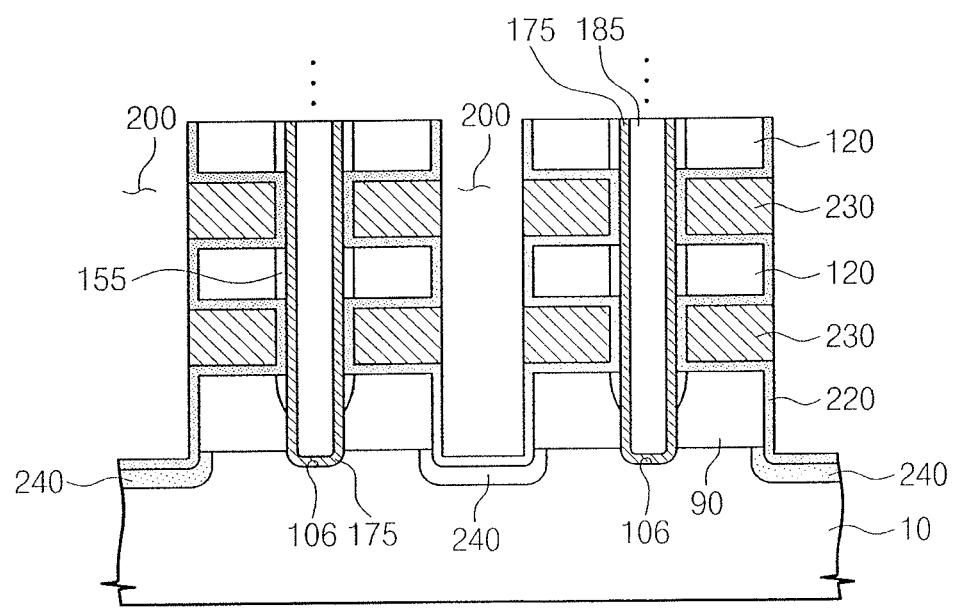

FIGS. 26 through 28 are sectional views illustrating methods of fabricating a three-dimensional semiconductor device according to second modifications of the third example embodiment. For concise description, overlapping description of elements previously described with reference to FIGS. 1 through 25 may be omitted.

According to the present embodiments, the through hole 106 may be formed without using the first semiconductor pattern 165, as shown in FIG. 26. For instance, the steps of forming the first semiconductor layer 160 and the first semiconductor pattern 165 may be omitted, and the formation of the through hole 106 may include anisotropically etching the vertical layer 150 and the remaining portion of the underlying layer 90. Accordingly, the vertical pattern 155 may be localized within a region, which is included in the opening 105 but not in the through hole 106. Similar to the previously-described third embodiment, a bottom surface of the vertical pattern 155 may be positioned at a level equivalent to or higher than the top surface of the lower structure 10.

The through hole 106 may be filled with the second semiconductor pattern 175 and the gap-filling pattern 185, as shown in FIG. 27. As the result of the absence of the first semiconductor pattern 165, the outer sidewall of the second semiconductor pattern 175 may be formed to be in direct contact with the entire inner sidewall of the vertical pattern 155. In addition, below the vertical pattern 155, the second semiconductor pattern 175 may be formed to be in direct contact with the lower sidewall of the underlying layer 90.

Thereafter, the trenches 200 may be formed spaced apart from the second semiconductor pattern 175 to penetrate the layer stack 100, and then, the sacrificial layers 130 may be selectively removed to form the recess regions 210 exposing the sidewall of the vertical pattern 155. These steps may be performed by using or modifying the method described with reference to FIGS. 22 and 23.

According to the present embodiments, as described with reference to FIG. 8, before the formation of the intermediate layer 220, the vertical pattern 155 exposed by the recess region 210 may be further etched to expose the sidewall of the first semiconductor pattern 165. In this case, the intermediate layer 220 may be in direct contact with the exposed sidewall of the first semiconductor pattern 165, as shown in FIG. 28, and the vertical pattern 155 may include a plurality of portions vertically separated by the intermediate layer 220.

[Fourth Example Embodiments and Modifications Thereof]

Figure 29:
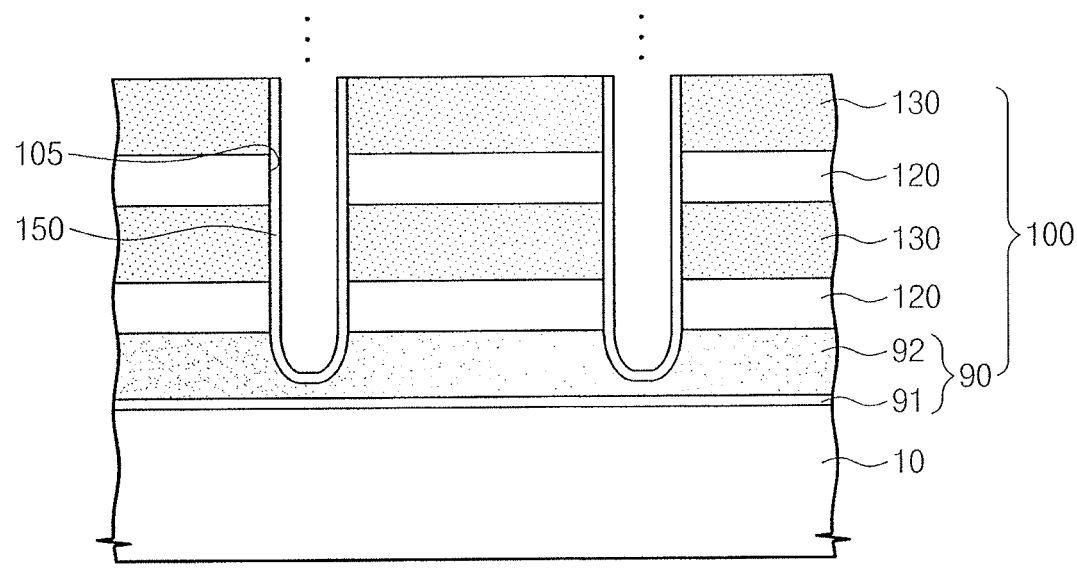
FIGS. 29 through 31 illustrate sectional views of stages in methods of fabricating a three-dimensional semiconductor device according to a fourth example embodiment.
Figure 30:
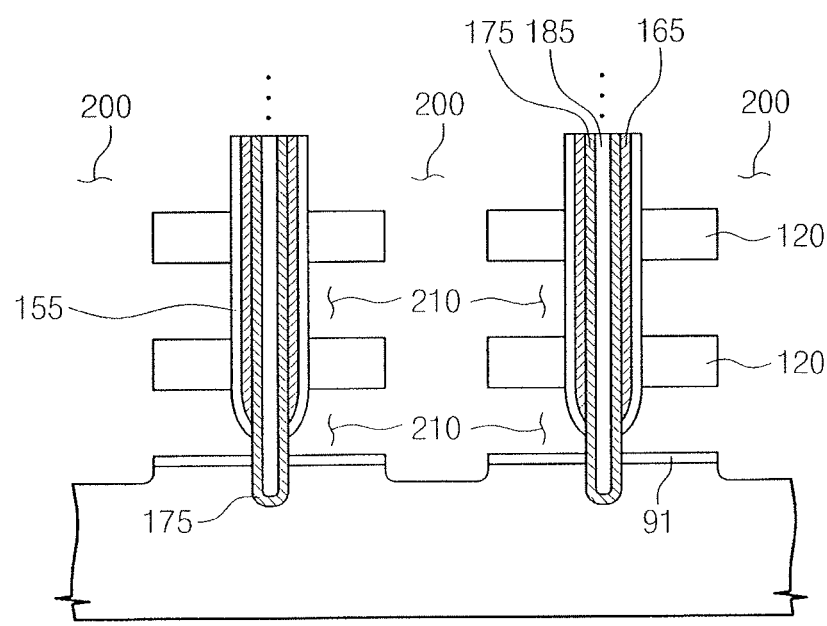
Figure 31:
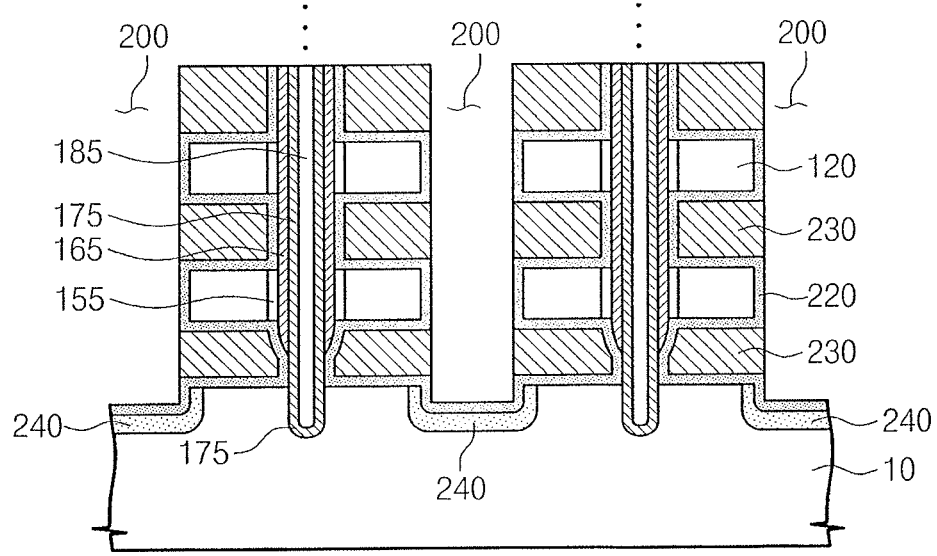
Figure 32:
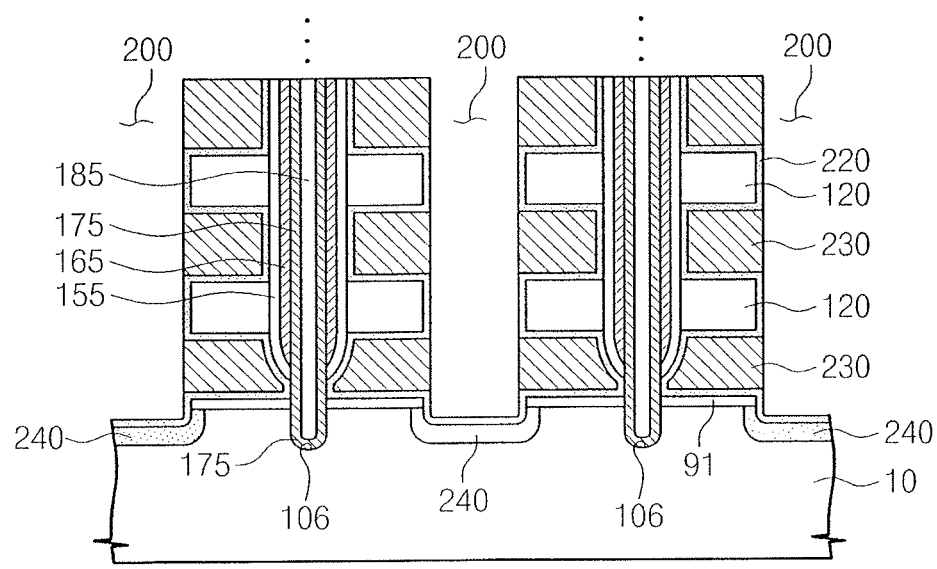
FIGS. 32 through 36 illustrate sectional views of stages in methods of fabricating a three-dimensional semiconductor device according to first to fourth modifications of the fourth example embodiment.

FIGS. 29 through 31 are sectional views illustrating methods of fabricating a three-dimensional semiconductor device according to a fourth example embodiment. FIG. 32 is a sectional view illustrating methods of fabricating a three-dimensional semiconductor device according to first modifications of the fourth example embodiments. For concise description, overlapping description of elements previously described with reference to FIGS. 1 through 28 may be omitted.

According to the present embodiments, as shown in FIG. 29, the underlying layer 90 may include a first underlying layer 91 and a second underlying layer 92 sequentially stacked on the lower structure 10. The first underlying layer 91 may be different from the second underlying layer 92 in terms of material and/or thickness. For example, the first underlying layer 91 may be a silicon oxide layer, whose thickness is smaller than that of the second underlying layer 92.

In some embodiments, the second underlying layer 92 may be formed of an insulating material having an etch selectivity with respect to at least one of the interlayer dielectric 120 or the sacrificial layer 130. For instance, the second underlying layer 92 may be formed of the substantially same material as the underlying layer 90 in the third embodiments. Accordingly, the second underlying layer 92 may serve as an etch stop layer during the formation of the opening 105, and the bottom surface of the opening 105 may be defined by the second underlying layer 92.

In other embodiments, the second underlying layer 92 may be formed of a material, which can be etched along with the sacrificial layer 130 during the formation of the recess regions. For instance, under an etch recipe used to form the recess region, the second underlying layer 92 may be formed of a material having an etch selectivity with respect to the interlayer dielectric 120 but not having such an etch selectivity with respect to the sacrificial layer 130. In this case, as shown in FIG. 30, the recess regions 210 may be formed to expose a top surface of the first underlying layer 91 and a portion of the lower sidewall of the second semiconductor pattern 175. The recess region 210 may be filled with the intermediate layer 220 and the conductive patterns 230, as shown in FIGS. 31 and 32.

In some embodiments, as described with reference to FIG. 8, before the formation of the intermediate layer 220, the vertical pattern 155 exposed by the recess region 210 may be further etched to expose the sidewall of the first semiconductor pattern 165. In this case, the intermediate layer 220 may be in direct contact with the exposed sidewall of the first semiconductor pattern 165, as shown in FIG. 31, and the vertical pattern 155 may include a plurality of portions vertically separated by the intermediate layer 220.

In the case that the first underlying layer 91 does not have an etch selectivity with respect to the vertical pattern 155, the first underlying layer 91 may be removed during the etching of the vertical pattern 155. In this case, as shown in FIG. 31, the intermediate layer 220 may be formed to directly cover the top surface of the lower structure 10.

In other embodiments, as described previously with reference to FIG. 10, the additional etching of the vertical pattern 155 may be omitted. In this case, as shown in FIG. 32, the vertical pattern 155 may remain between the intermediate layer 220 and the first semiconductor pattern 165 and may serve as the memory layer along with the intermediate layer 220. Furthermore, as shown in FIG. 32, a portion of the intermediate layer 220 disposed between the lowermost conductive pattern and the second semiconductor pattern 175 may be in direct contact with both of the vertical pattern 155 and the second semiconductor pattern 175.

FIGS. 33 through 36 are sectional views illustrating methods of fabricating a three-dimensional semiconductor device according to second to fourth modifications of the fourth example embodiment. For concise description, overlapping description of elements previously described with reference to FIGS. 1 through 32 may be omitted.

Figure 33:
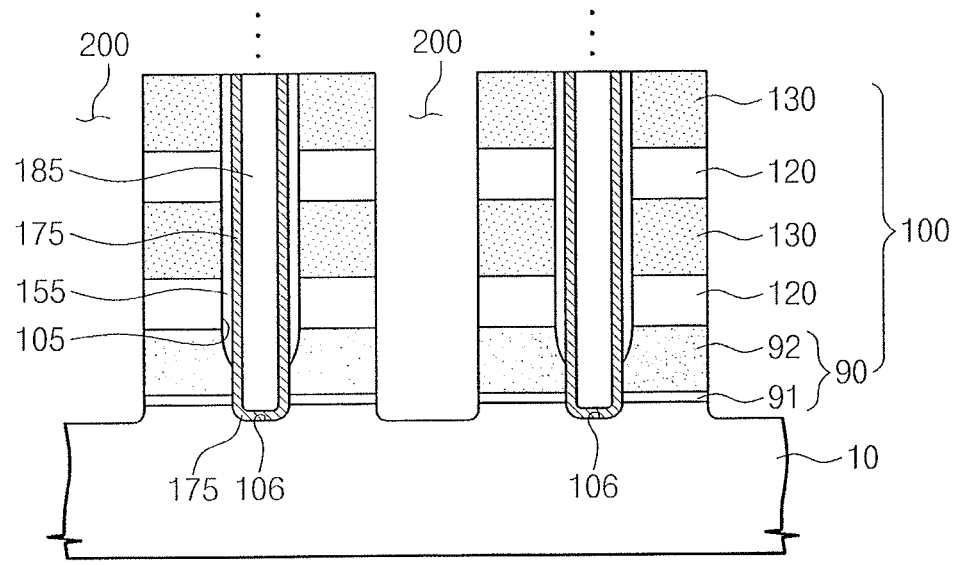
Figure 34:
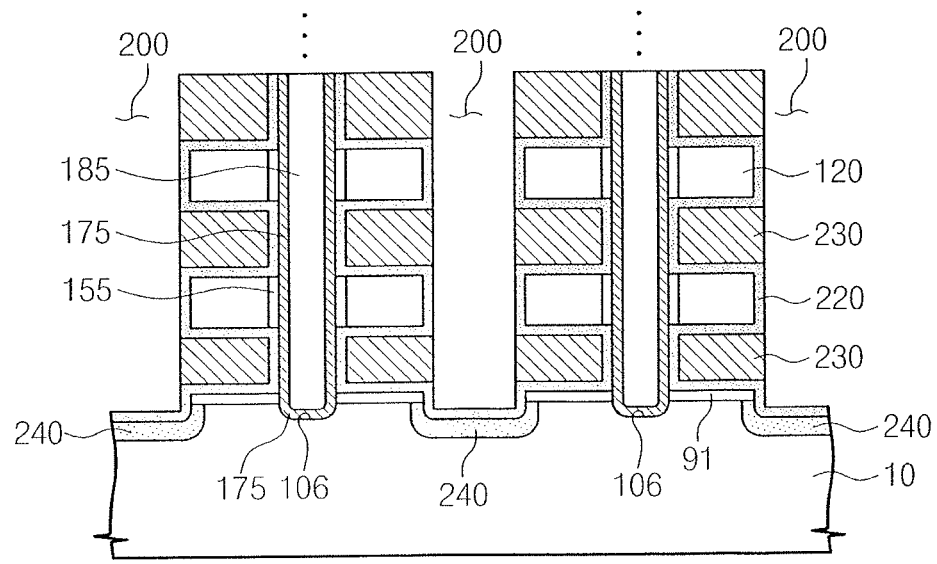

According to second modifications of the fourth embodiments, the underlying layer 90 may include the first underlying layer 91 and the second underlying layer 92, as described with reference to FIG. 29, but process steps after the formation of the underlying layer 90 may be performed using the method described with reference to FIGS. 26 through 28. For instance, the methods of fabricating a three-dimensional semiconductor device may be performed without formation of the first semiconductor pattern 165 described with reference to FIG. 30, and thus, the second semiconductor pattern 175 may be directly connected to the lower structure 10 through the vertical pattern 155, as shown in FIG. 33. In addition, during formation of the recess region 210, the second underlying layer 92 and the sacrificial layer 130 may be removed together, such that the intermediate layer 220 may be formed in direct contact with the first underlying layer 91 and the second semiconductor pattern 175, as shown in FIG. 34.

Figure 35:
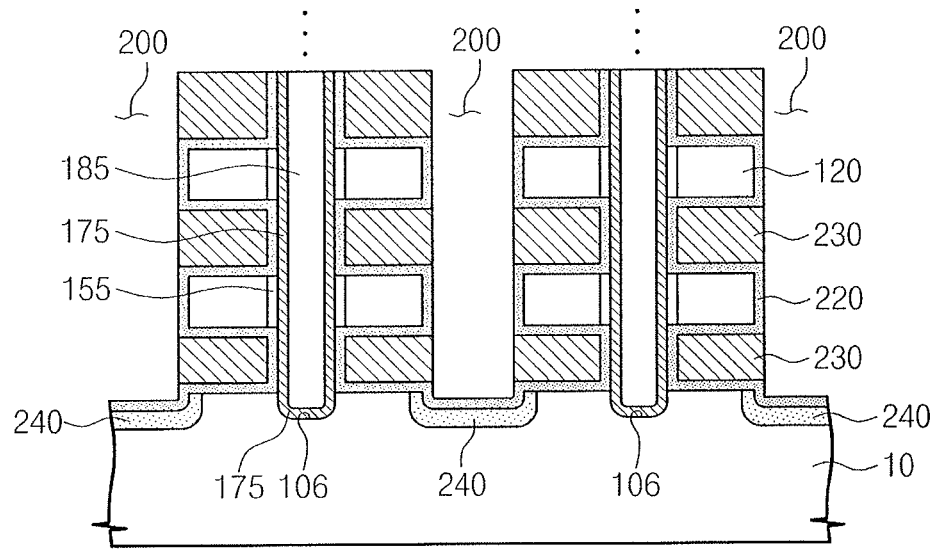

According to third modifications of the fourth embodiments the first underlying layer 91 may be removed during the etching of the vertical pattern 155. As a result, as shown in FIG. 35, the intermediate layer 220 may be formed to directly cover the top surface of the lower structure 10, without an interposition of the first underlying layer 91.

Figure 36:
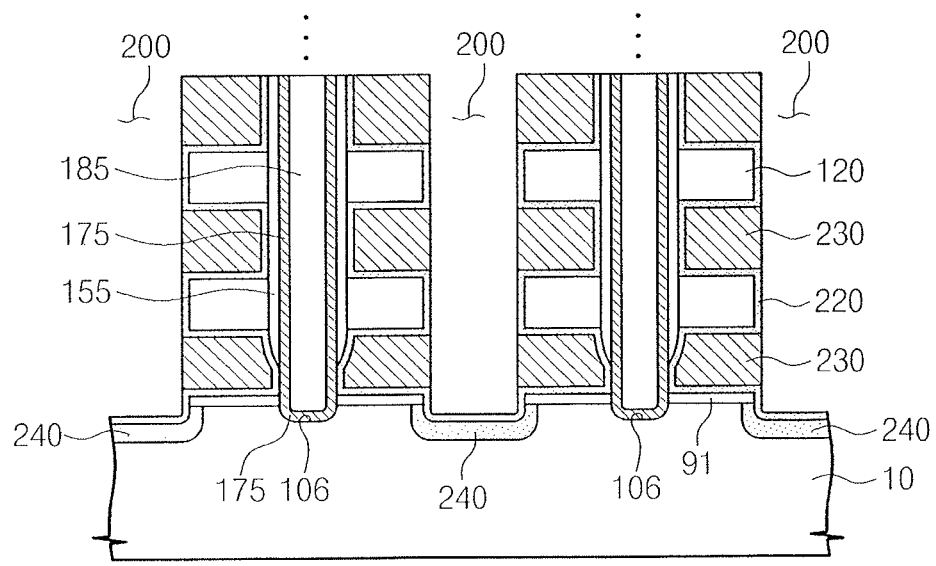

According to fourth modifications of the fourth embodiment, the step of etching the vertical pattern 155 to expose the sidewall of the second semiconductor pattern 175 may be omitted. Accordingly, as shown in FIG. 36, the vertical pattern 155 may remain between the intermediate layer 220 and the second semiconductor pattern 175, and may serve as the memory layer along with the intermediate layer 220.

[Fifth Example Embodiments and Modifications Thereof]

Figure 37:
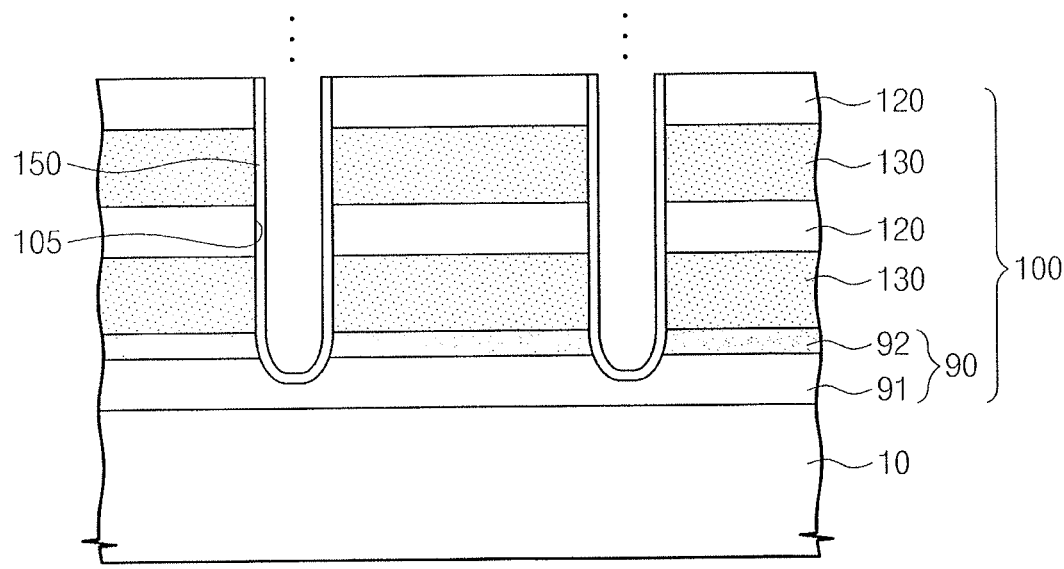
FIGS. 37 and 38 illustrate sectional views of stages in methods of fabricating a three-dimensional semiconductor device according to a fifth example embodiment.
Figure 38:
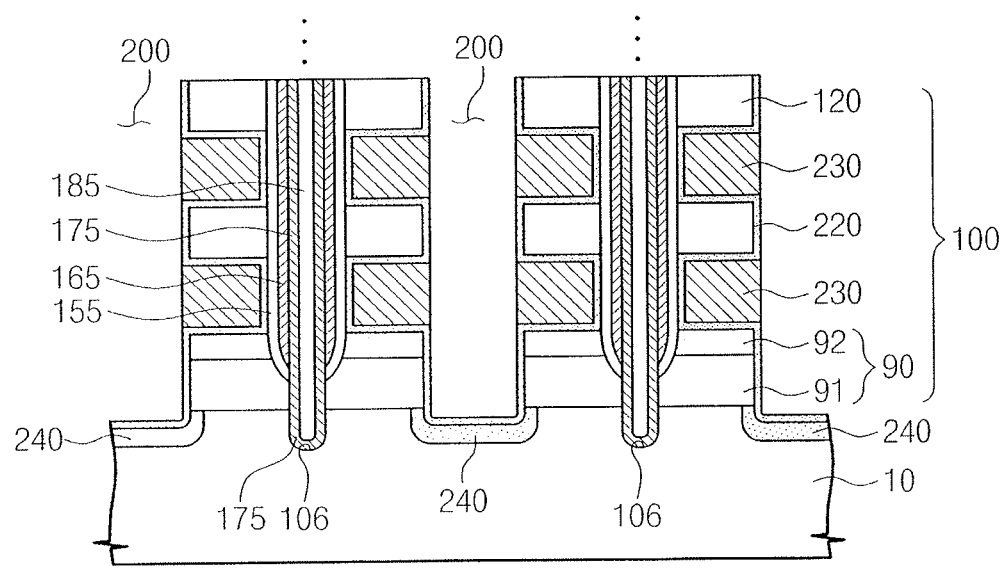

FIGS. 37 and 38 are sectional views illustrating methods of fabricating a three-dimensional semiconductor device according to fifth example embodiments of the inventive concepts. For concise description, overlapping description of elements previously described with reference to FIGS. 1 through 36 may be omitted.

According to the present embodiments, as shown in FIG. 37, the underlying layer 90 may include a first underlying layer 91 and a second underlying layer 92 sequentially stacked on the lower structure 10. The first underlying layer 91 may be different from the second underlying layer 92 in terms of material and/or thickness. In view of this, these embodiments may be identical to the previous embodiments described with reference to FIG. 29. However, unlike the previous embodiments, the first underlying layer 91 of the present embodiments may be thicker than the second underlying layer 92.

Similar to the previous embodiments, the second underlying layer 92 may serve as an etch stop layer during the formation of the opening 105. For example, as shown in FIG. 37, the opening 105 may be formed to penetrate through the second underlying layer 92, such that the bottom surface thereof may be defined by the first underlying layer 91. In another example, the opening 105 may be formed not to penetrate through the second underlying layer 92, such that the bottom surface of the opening may be in the second underlying layer 92, as in the previous embodiments.

According to the present embodiments, the sacrificial layer 130 may be a layer of the layer stack 100 formed directly on the second underlying layer 92, unlike the previous embodiments described with reference to FIGS. 29 through 36. As a result, the first and second underlying layers 91 and 92 may be interposed between the conductive pattern 230 and the lower structure 10, as shown in FIG. 38. These process steps may be performed by using the method described with reference to FIGS. 19 through 28.

According to other modifications of the present embodiments, although not depicted, the intermediate layer 220 may be formed to vertically separate the vertical pattern 155 into a plurality of portions and to be in direct contact with the sidewall of the first semiconductor pattern 165, similar to the structure shown in FIG. 24. According to still other modifications of the present embodiments, the methods of fabricating a three-dimensional semiconductor device may be performed without forming the first semiconductor pattern 165, and thus, the second semiconductor pattern 175 may be in direct contact with the inner sidewall of the vertical pattern 155, similar to the structure shown in FIG. 28 or FIG. 34.

[Other Modified Embodiments]

Figure 39:
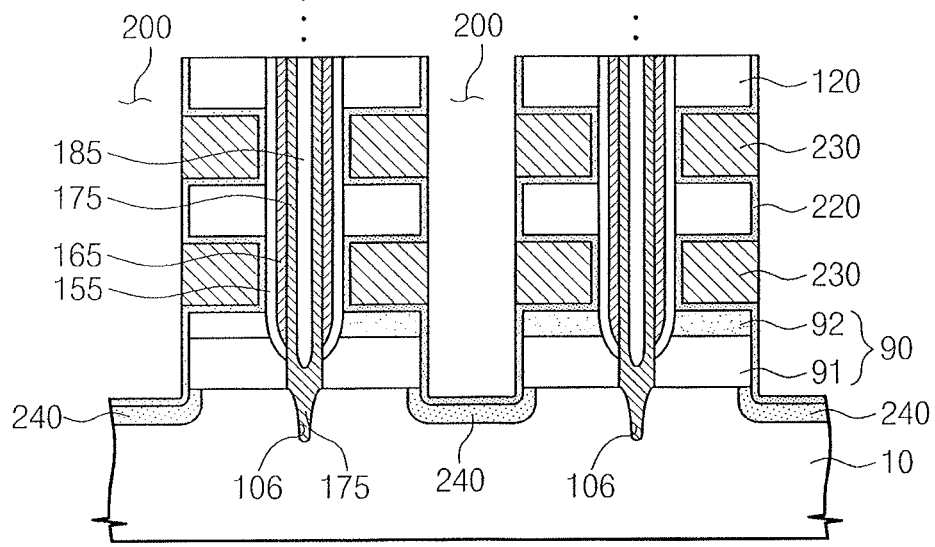
FIG. 39 illustrates a sectional view provided to exemplarily describe other modifications of the previously-described embodiments.

FIG. 39 is a sectional view provided to exemplarily describe modifications of the previously-described first through fifth embodiments. That is, each of the first through fifth embodiments may be modified to have the following technical features described with reference to FIG. 39.

The through hole 106 may be formed to have a downwardly tapered shape. For example, as shown in FIG. 39, a width of the through hole 106 in the lower structure 10 may decrease with an increase of depth, and the second semiconductor pattern 175 may be formed to completely fill the through hole 106 provided in the lower structure 10. Thus, the bottom surface of the gap-filling pattern 185 may be formed at a level equivalent to or higher than the top surface of the lower structure 10.

[Sixth Example Embodiments and Modifications Thereof]

FIGS. 40 through 46 are sectional views illustrating methods of fabricating a three-dimensional semiconductor device according to a sixth example embodiment. FIG. 47 is a sectional view illustrating methods of fabricating a three-dimensional semiconductor device according to a modification of the sixth example embodiment. For concise description, overlapping description of elements previously described with reference to FIGS. 1 through 9 may be omitted.

Figure 40:
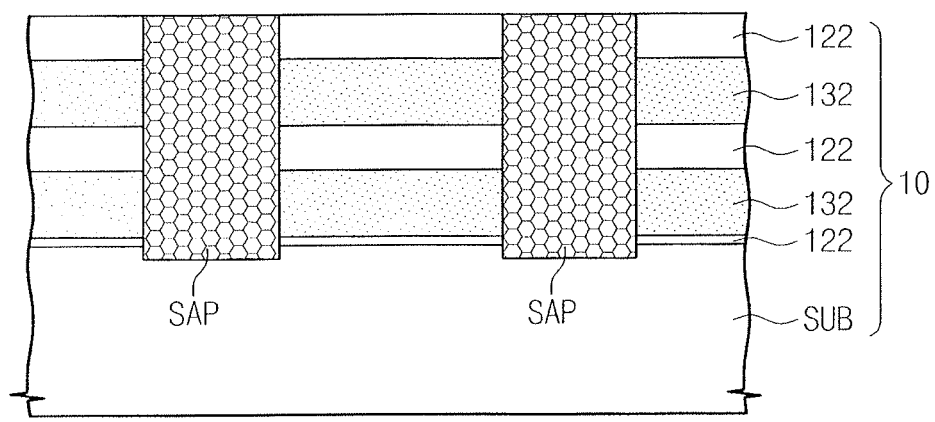
FIGS. 40 through 46 illustrate sectional views of stages in methods of fabricating a three-dimensional semiconductor device according to a sixth example embodiment.

According to the present embodiments, the lower structure 10 may include a substrate SUB and a lower layer stack disposed on the substrate SUB, as shown in FIG. 40. The lower layer stack may include lower horizontal layers 122 and lower sacrificial layers 132, which are alternatingly stacked on the substrate SUB. In addition, the lower structure 10 may further include selection active patterns (SAP) connected to the substrate SUB through the lower horizontal layers 122 and the lower sacrificial layers 132.

In some embodiments, the lower horizontal layers 122 and the lower sacrificial layers 132 may be formed of substantially the same materials as the interlayer dielectric 120 and the sacrificial layer 130, respectively, described with reference to FIG. 1. In other embodiments, the lower horizontal layer 122 may be formed of at least one conductive material. Technical features related to the selection active pattern SAP and the modified embodiments related to the lower horizontal layer 122 may be realized using the methods disclosed in U.S. patent application Ser. No. 13/072,078, filed on Mar. 25, 2011, the entire contents of which are incorporated as part of this application.

Figure 41:
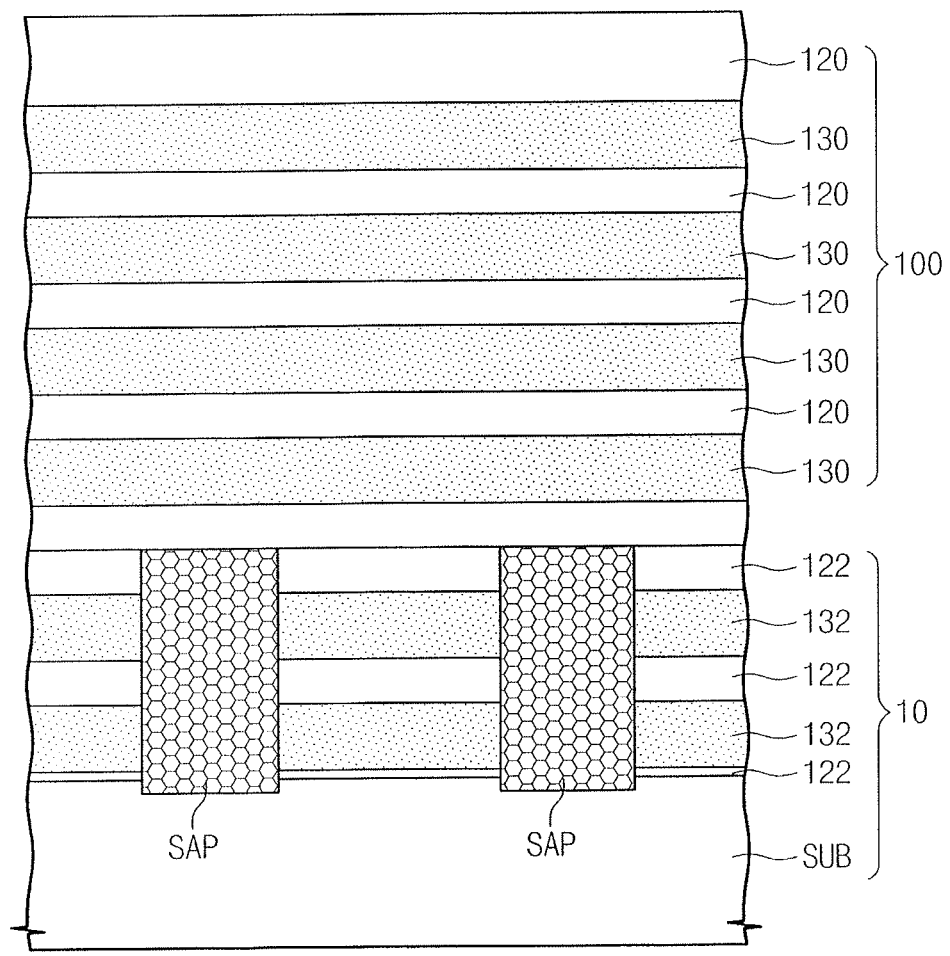
Figure 42:
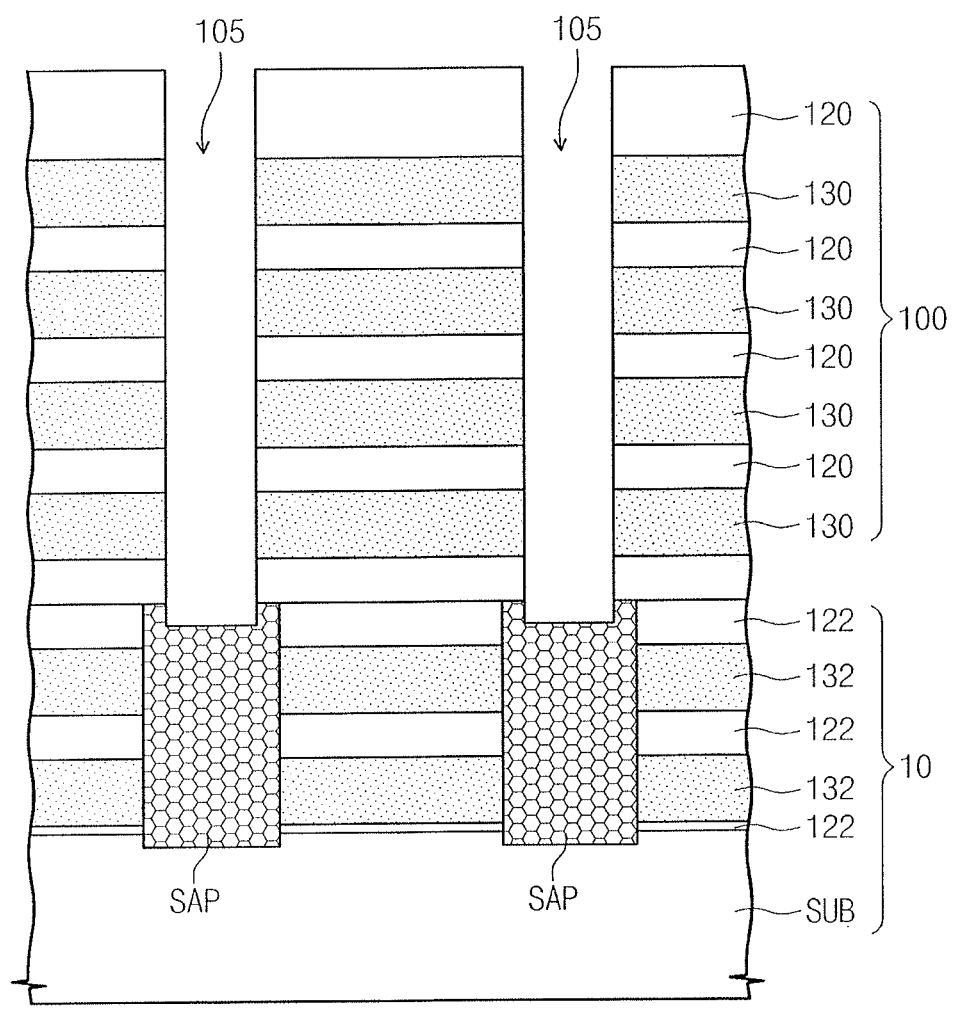

Thereafter, as shown in FIG. 41, the layer stack 100 may be formed on the resultant structure provided with the selection active pattern SAP. As shown in FIG. 42, the openings 105 may be formed through the layer stack 100 to expose the lower structure 10. In some embodiments, the opening 105 may be formed to expose a top surface of the selection active pattern SAP, as shown in FIG. 42. The top surface of the selection active pattern SAP may be recessed during the formation of the opening 105.

Figure 43:
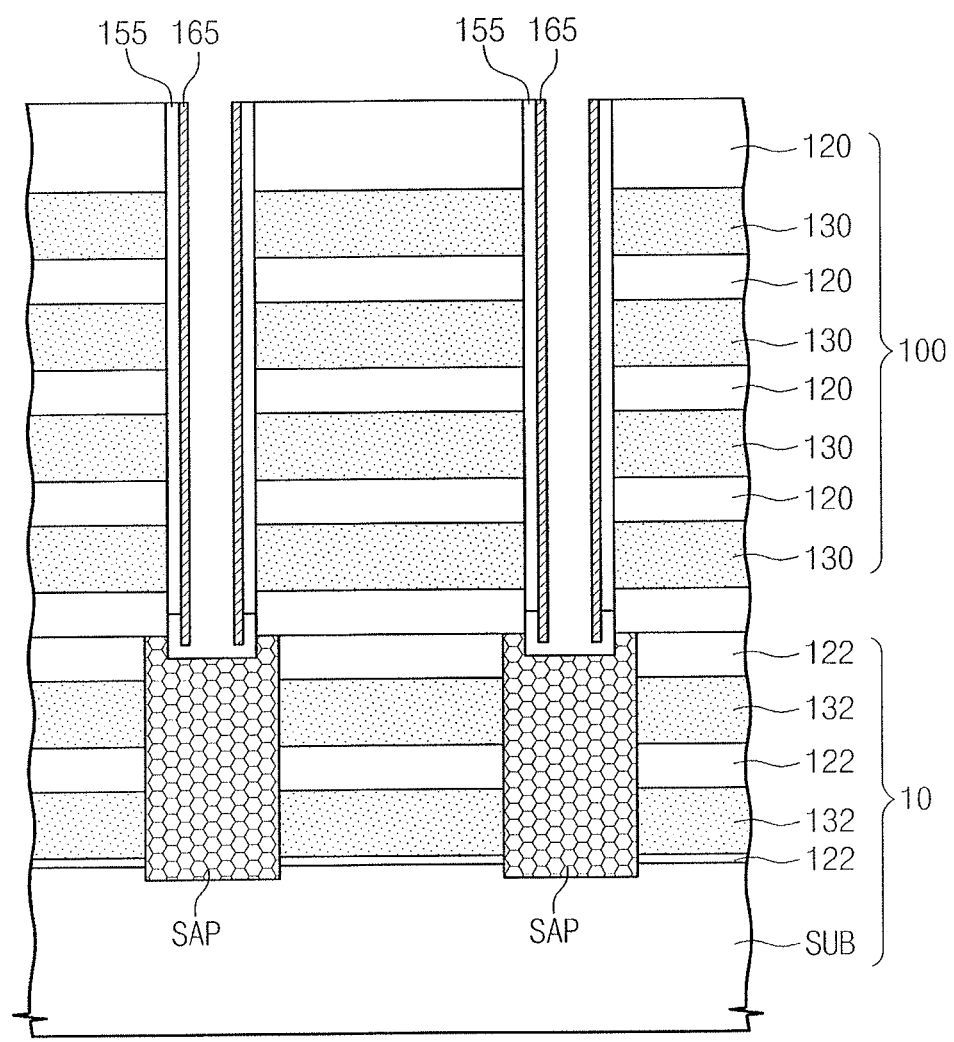

As shown in FIG. 43, the vertical pattern 155 and the first semiconductor pattern 165 may be formed in the opening 105. The vertical pattern 155 may be interposed between the first semiconductor pattern 165 and the layer stack 100, and may be formed to expose the lower sidewall of the layer stack 100. The formation of the vertical pattern 155 and the first semiconductor pattern 165 may be performed using the methods described with reference to FIGS. 3 and 4.

Figure 44:
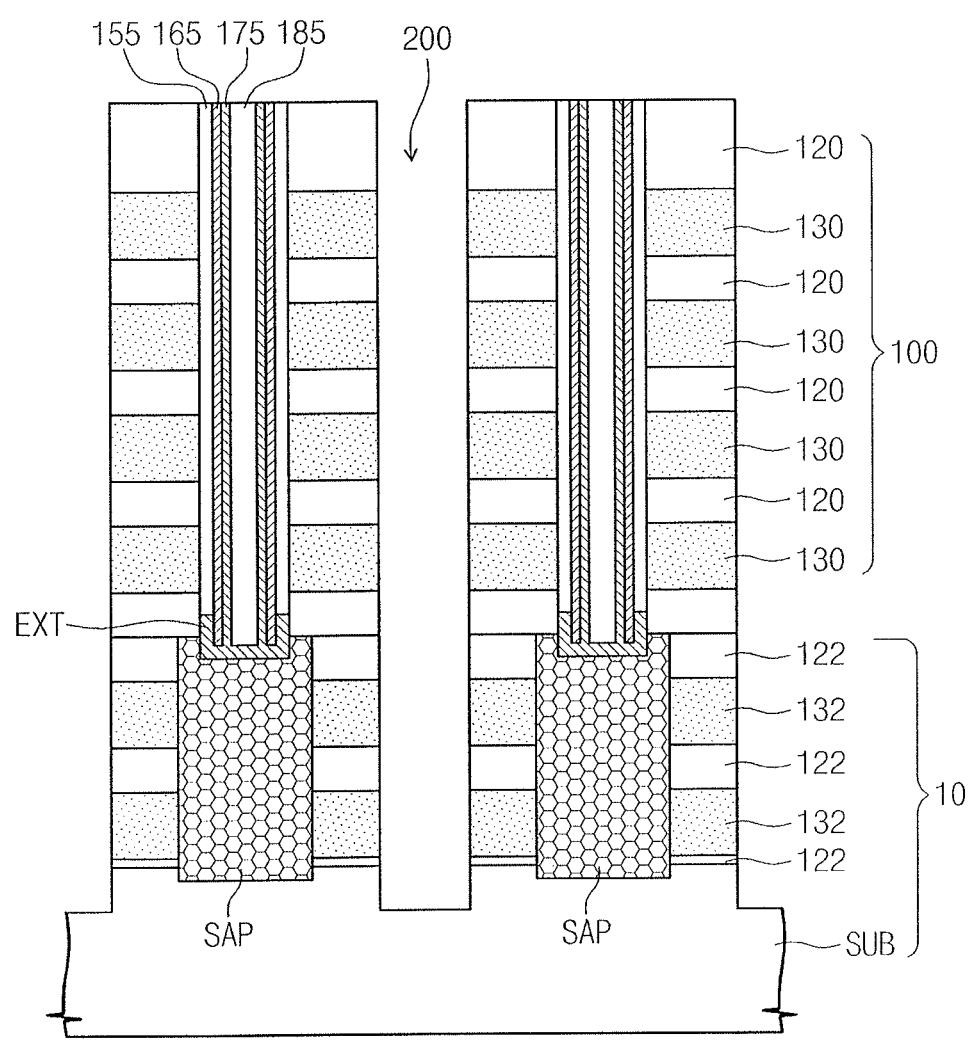

As shown in FIG. 44, the second semiconductor pattern 175 and the gap-filling pattern 185 may be formed in the opening 105 provided with the vertical pattern 155 and the first semiconductor pattern 165. The second semiconductor pattern 175 may be formed to cover the lower sidewall of the layer stack 100 exposed by the vertical pattern 155. For instance, the second semiconductor pattern 175 may include an extension EXT interposed between the first semiconductor pattern 165 and the layer stack 100, e.g., the extension EXT may be continuous with the second semiconductor pattern 175 to surround a bottom edge of the first semiconductor pattern 165. For example, the extension EXT of the second semiconductor pattern 175 may extend in parallel to the first semiconductor pattern 165, and may be in contact, e.g., direct contact, with the layer stack 100, the first semiconductor pattern 165, and the vertical pattern 155. In some embodiments, the extension EXT may have a top surface located at a higher level than the bottom surface of the layer stack 100 and the top surface of the selection active pattern SAP. The formation of the second semiconductor pattern 175 and the gap-filling pattern 185 may be performed using the methods described with reference to FIG. 5.

The trench 200 may be formed through the layer stack 100 to expose the lower structure 10. The formation of the trench 200 may be performed using the methods described with reference to FIG. 6. In some embodiments, the trench 200 may be formed to penetrate the lower horizontal layers 122 and the lower sacrificial layers 132 and expose the substrate SUB, as shown in FIG. 44.

Figure 45:
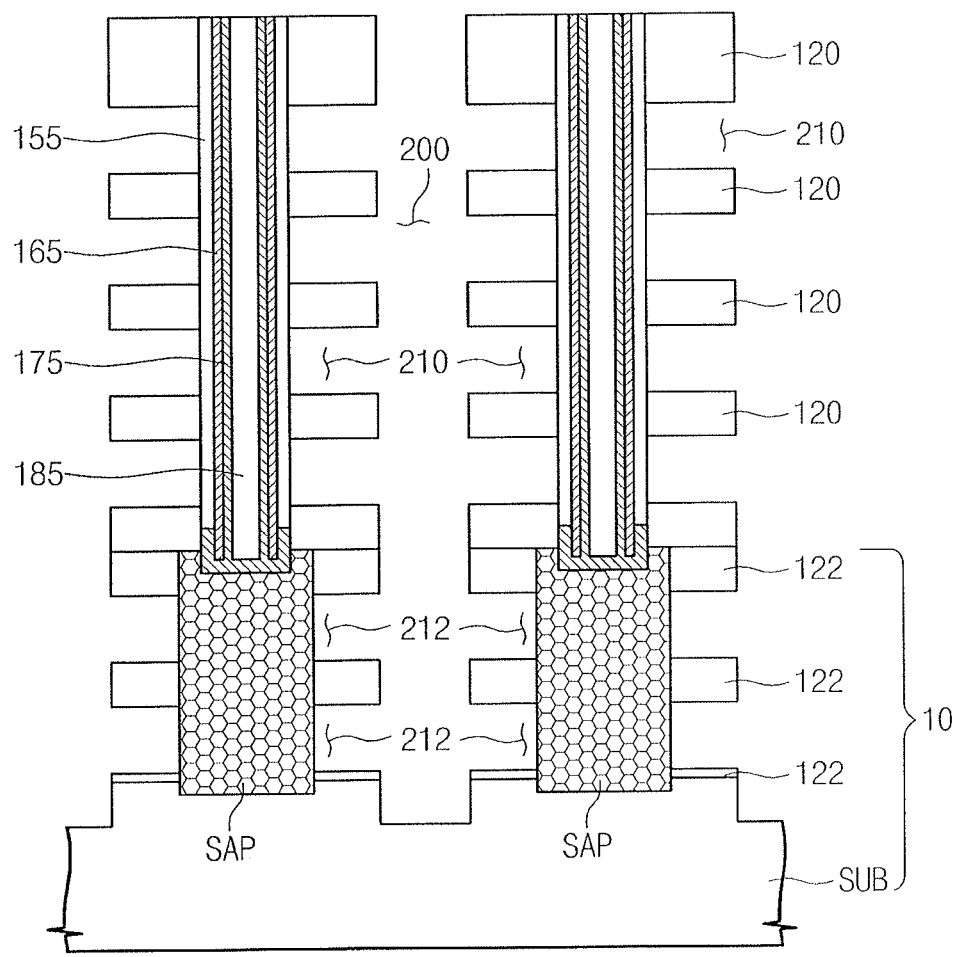

The sacrificial layers 130 may be removed to form the recess regions 210 exposing the sidewall of the vertical pattern 155, as shown in FIG. 45. The formation of the recess regions 210 may be performed using the methods described with reference to FIG. 7. As described above, according to some embodiments of the inventive concepts, the lower horizontal layer 122 and the lower sacrificial layer 132 may be formed of substantially the same materials as the interlayer dielectric 120 and the sacrificial layer 130, respectively. In this case, as shown in FIG. 45, the lower sacrificial layer 132 may be removed along with the sacrificial layers 130, such that lower recess regions 212 may be formed in the lower structure 10. In some embodiments, the lower recess regions 212 may be formed to expose a sidewall of the selection active pattern SAP.

Figure 46:
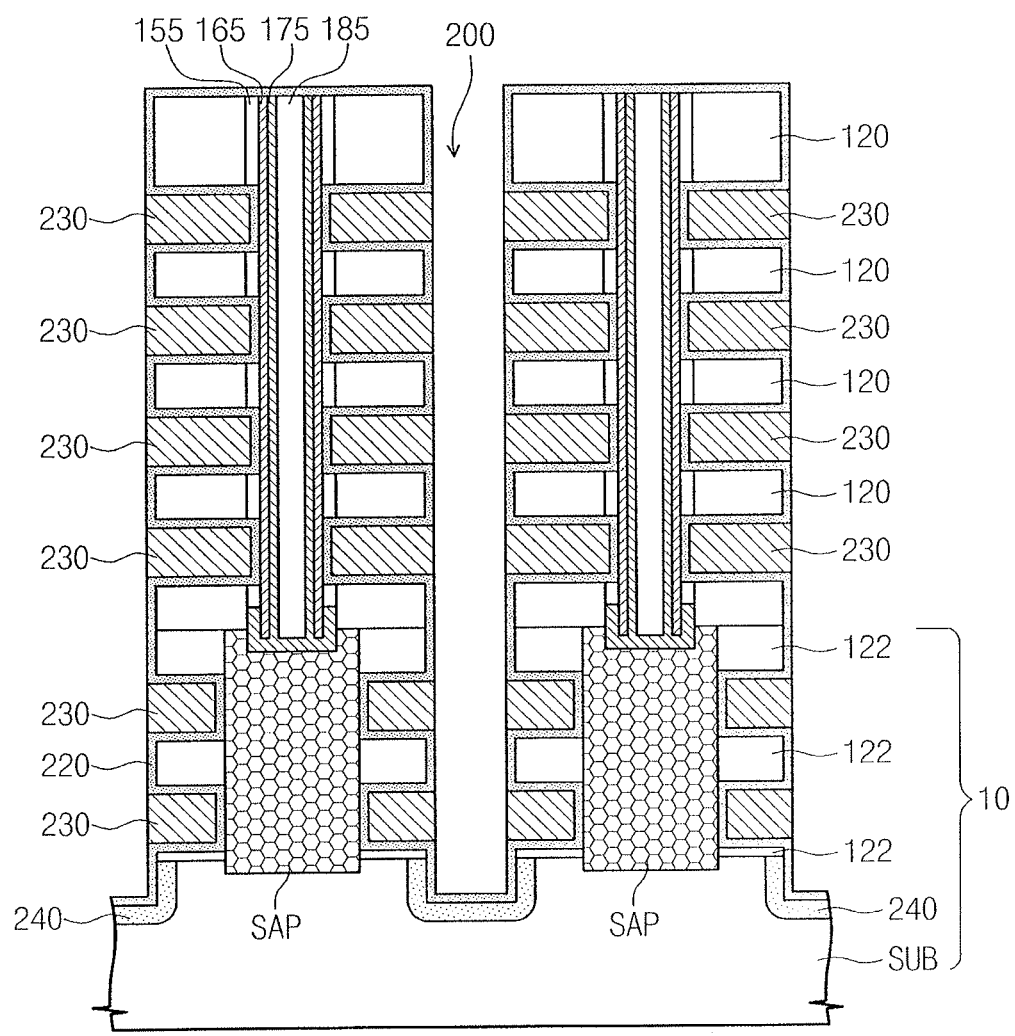
Figure 47:
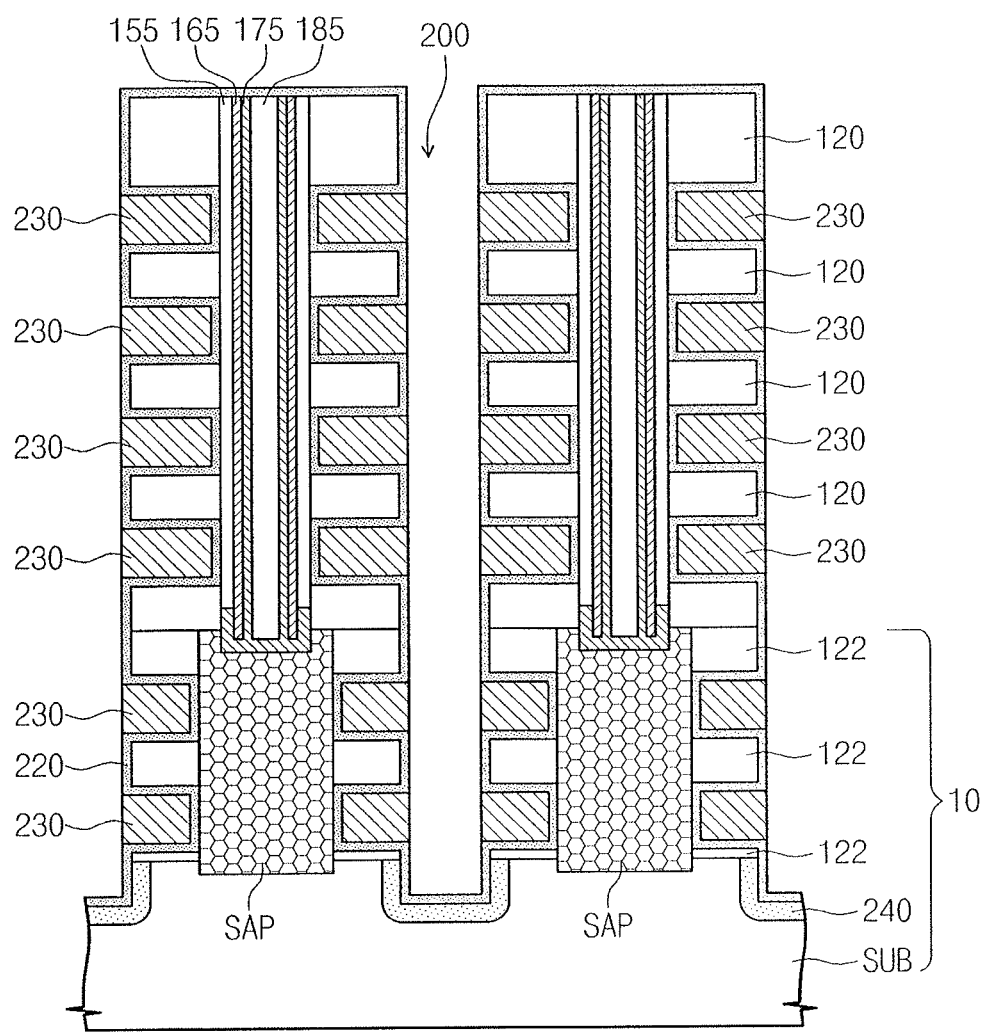
FIG. 47 illustrates a sectional view of a method of fabricating a three-dimensional semiconductor device according to modifications of the sixth example embodiment.

As shown in FIGS. 46 and 47, the intermediate layer 220 and the conductive patterns 230 may be formed in the recess regions 210 and the lower recess regions 212. In some embodiments, the formation of the intermediate layer 220 and the conductive patterns 230 may be performed using the methods described with reference to FIGS. 8 and 9. In this case, as shown in FIG. 46, the intermediate layer 220 may be formed to directly cover the sidewall of the first semiconductor pattern 165 and the sidewall of the selection active pattern SAP. In other embodiments, the formation of the intermediate layer 220 and the conductive patterns 230 may be performed using the methods described with reference to FIG. 10. In this case, as shown in FIG. 47, the intermediate layer 220 may be formed to directly cover the sidewall of the vertical pattern 155 and the sidewall of the selection active pattern SAP. According to the sixth embodiment, the selection active pattern SAP may serve as a channel region of a selection transistor (e.g., a ground selection transistor), and the conductive pattern 230 adjacent thereto may serve as a gate electrode of the selection transistor.

It is noted that if the lower inner sidewall of the layer stack 100 is not exposed, i.e., if the process of etching the lower portion of the vertical pattern 155 described with reference to FIG. 43 is omitted, the vertical pattern 155 may have a hook shape, i.e., a mirror-image of a "L" shape, having a portion remaining between the selection active pattern SAP and the second semiconductor pattern 175. In other words, a lower portion of the vertical pattern 155 may contact the second semiconductor pattern 175 to cover, e.g., to completely overlap, a bottom surface of the first semiconductor pattern 165. If the lower portion of the vertical pattern 155 covers the bottom surface of the first semiconductor pattern 165, a path length of an electric current passing the first and second semiconductor patterns 165 and 175 and the selection active pattern SAP may increase, thereby increasing resistance of the electric current path or reducing the operating current.

In addition, when the vertical pattern 155 is not etched and extends into the selection active pattern SAP, a portion of the selection active pattern SAP may surround lower regions of the first and second semiconductor patterns 165 and 175. That is, the portion of the selection active pattern SAP may be interposed between the conductive pattern 230 and the lower regions of the first and second semiconductor patterns 165 and 175, thereby serving as a shielding element. In this case, the semiconductor device may exhibit increased resistance of the electric current path or reduced operating current.

[Seventh Example Embodiments and Modifications Thereof]

Figure 48:
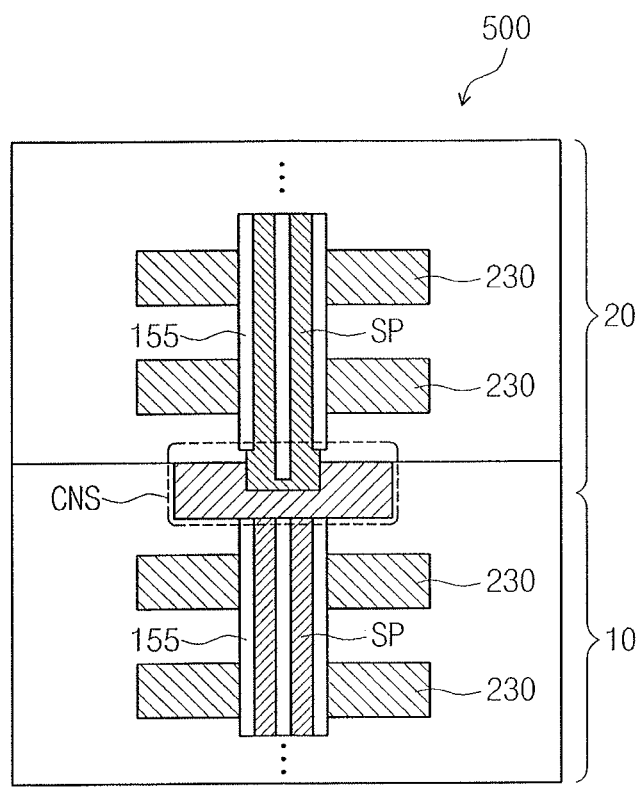
FIG. 48 illustrates a schematic sectional view of three-dimensional semiconductor devices according to a seventh example embodiment.
Figure 49:
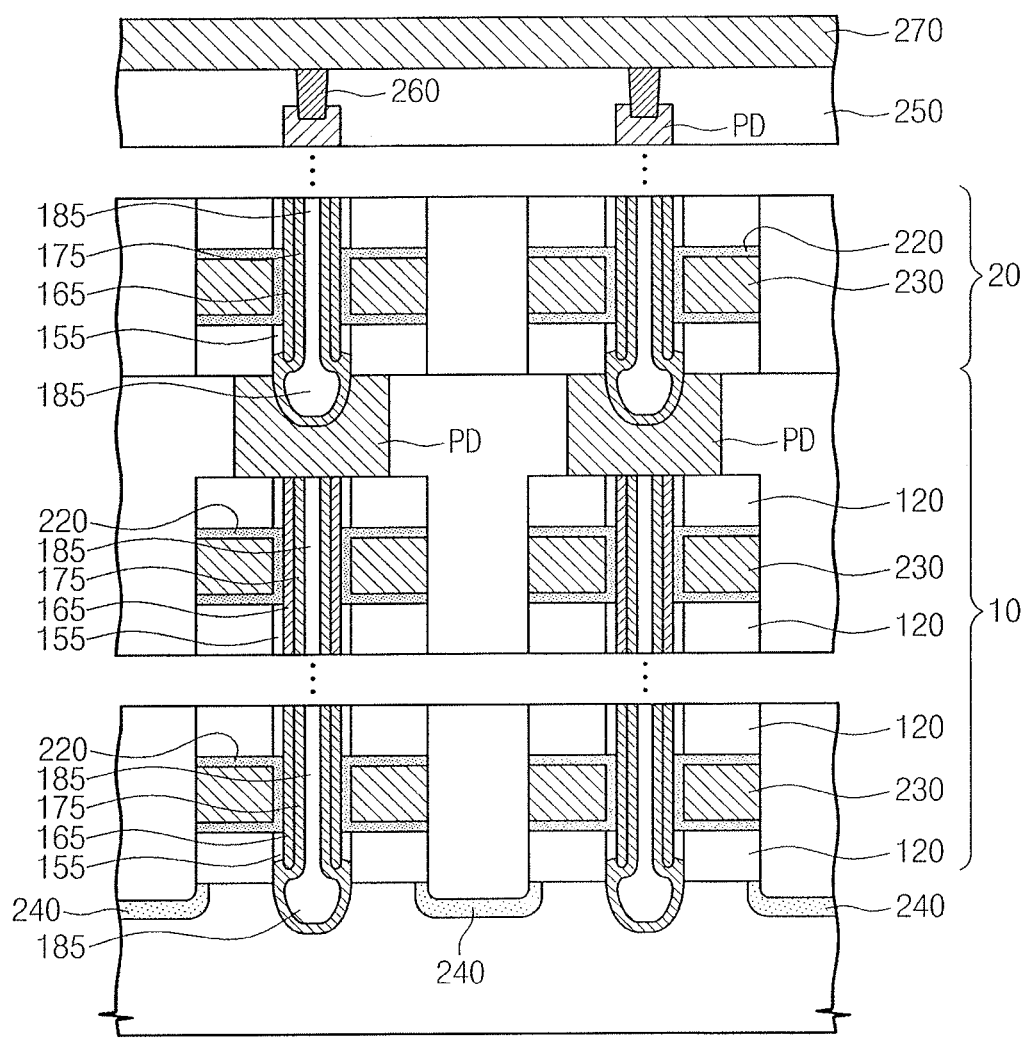
FIGS. 49 through 51 illustrate schematic sectional views of three-dimensional semiconductor devices according to modifications of the seventh example embodiments.
Figure 50:
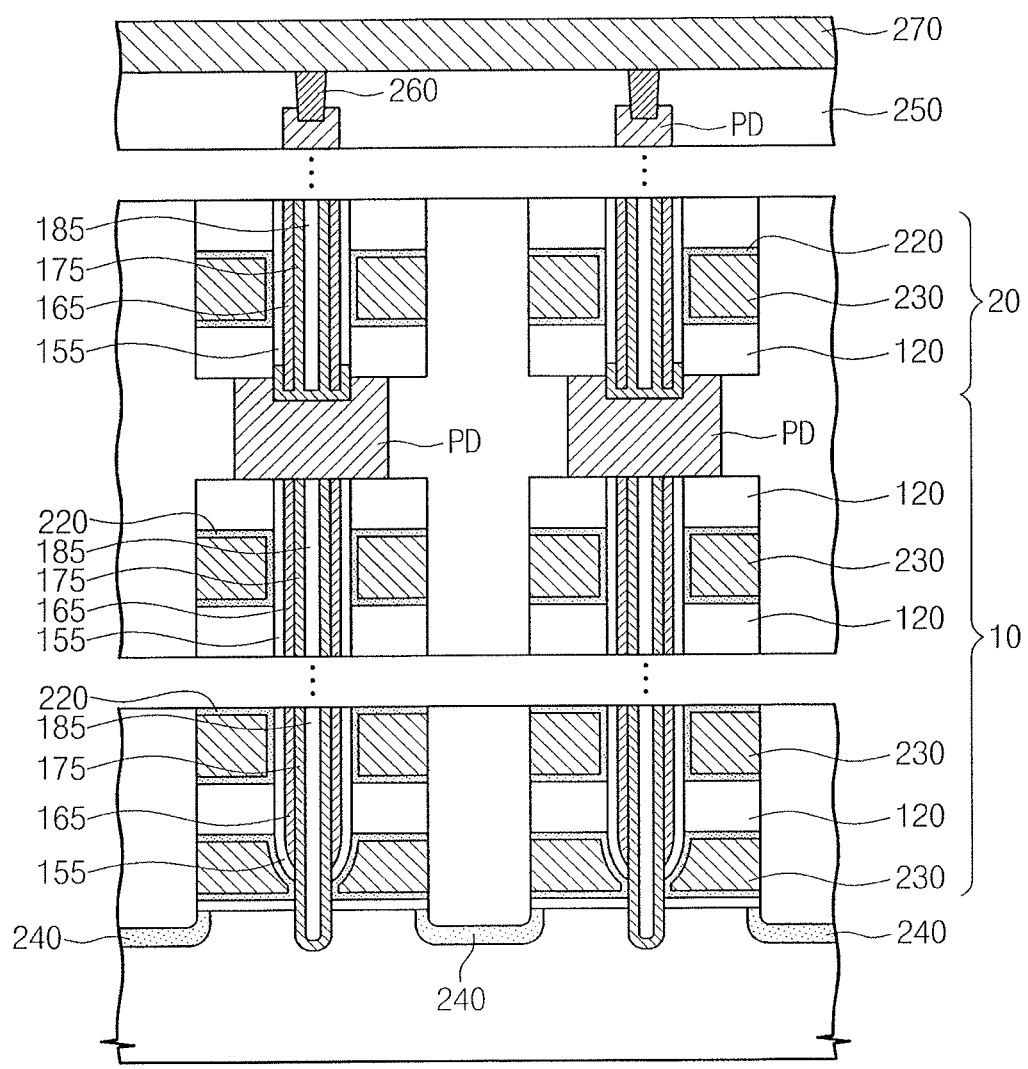
Figure 51:
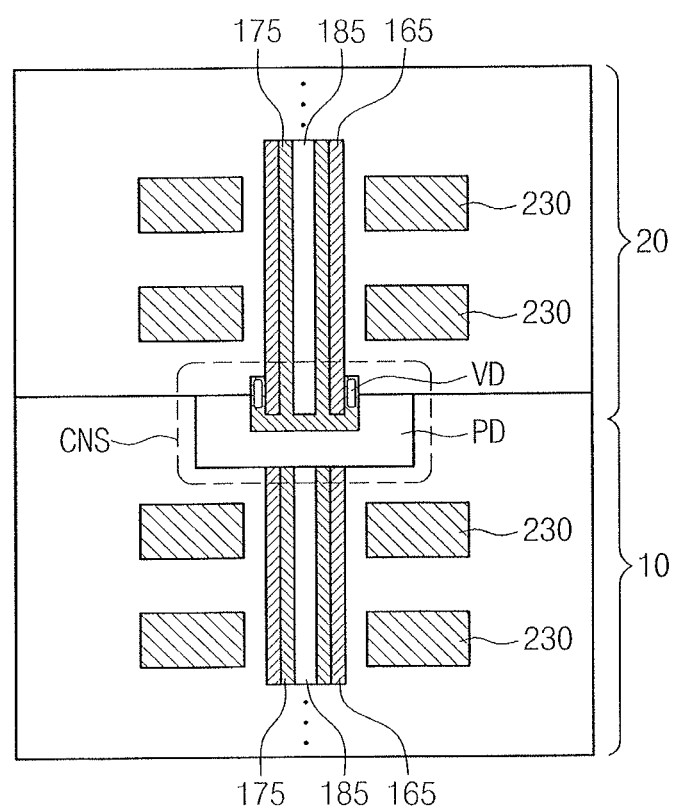

FIG. 48 is a schematic sectional view illustrating three-dimensional semiconductor devices according to a seventh example embodiment. FIGS. 49 through 51 are schematic sectional views of three-dimensional semiconductor devices according to modifications of the seventh example embodiment.

Referring to FIG. 48, a three-dimensional semiconductor device 500 may include the lower structure 10 and an upper structure 20, which may be configured to have the substantially same structure as the lower structure 10, and may be sequentially stacked. In some embodiments, each of the lower and upper structures 10 and 20 may be configured to include elements disposed between the lower structure 10 and the upper plug 260 in the previous embodiments described with reference to FIGS. 1 through 47. For example, each of the lower and upper structures 10 and 20 may include a plurality of the conductive patterns 230 located at different levels, as shown FIG. 48.

In addition, the three-dimensional semiconductor device 500 may include semiconductor patterns (or vertical channels) SP vertically penetrating the lower and upper structures 10 and 20, and vertical patterns 155 interposed between the lower and upper structures 10 and 20 and the semiconductor patterns SP. In some embodiments, the vertical pattern 155 in the upper structure 20 may be formed to have a bottom surface positioned at a vertical level equivalent to or higher than a top surface of the lower structure 10. In some embodiments, illustrated, for example, in FIG. 49, a bottom surface of each of the semiconductor patterns (or vertical channels) SP may be at a vertical level lower than an uppermost surface of a corresponding one of the pad patterns PD. Also, in some embodiments, each of the pad patterns PD may have a recessed upper surface that is in direct contact with a bottom surface of a corresponding one of the semiconductor patterns, as illustrated, for example, in FIG. 49. Also, in some embodiments, a distance between the bottom surface of the upper insulating spacer (e.g., insulating spacer 155 in FIG. 49) and the uppermost surface of the pad pattern PD may be less than a thickness of one of the second electrodes.

In some embodiments, the lower structure 10 may further include a connection structure CNS for establishing an electric connection to the upper structure 20. The fabricating methods of the previous embodiments described with reference to FIGS. 1 through 47 may be used to form the connection structure CNS, the semiconductor patterns SP, the vertical patterns 155, and the lower and upper structures 10 and 20. For example, as exemplarily shown in FIG. 48, the lower and upper structures 10 and 20 may be formed to have the three-dimensional semiconductor device according to the first embodiments described with reference to FIGS. 1 through 8. In some embodiments, the lower structure 10 may include a selection transistor between a semiconductor layer (e.g., semiconductor pattern 165 in FIG. 47) and the upper structure 20. The selection transistor may include a selection semiconductor pattern (e.g., SAP in FIG. 47) directly connected to a corresponding one of the pad patterns PD.

With regard to the method for forming the semiconductor patterns SP, e.g., first and second semiconductor patterns 165 and 175, the lower and upper structures 10 and 20 may be respectively formed by two methods of the previously described embodiments, which are selected to be different from each other. For example, as shown in FIG. 50, the lower structure 10 may be formed to have the structure of the embodiments described with reference to FIG. 32, and the upper structure 20 may be formed to have the structure of the embodiments described with reference to FIG. 47. Also, in some embodiments, the pad PD may be formed of a semiconductor material having a different conductivity type from the first and second semiconductor patterns (or vertical channels) 165 and 175.

In other embodiments, as shown in FIGS. 50 and 51, the intermediate layer 220 may be formed to cover a top surface, a bottom surface, and an inner sidewall of the conductive pattern 230, but may be removed from an outer sidewall of the conductive pattern 230 to expose a sidewall of the interlayer dielectric 120 adjacent to the trenches 200.

In still other embodiments, the second semiconductor pattern 175 may be formed to have a void VD, which may be filled with a gaseous medium, such as air. For example, as shown in FIG. 52, the void VD may be formed in a portion of the second semiconductor pattern 175 vertically disposed below the vertical pattern 155 and horizontally interposed between the first semiconductor pattern 165 and an inner wall of the opening 105.

Figure 52:
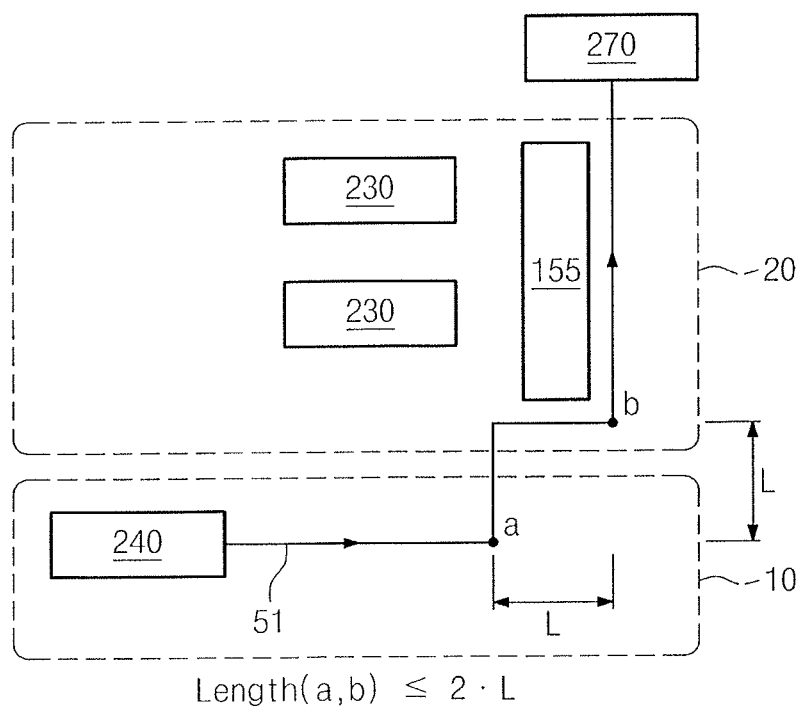
FIG. 52 illustrates a schematic diagram of a current pathway through a semiconductor device according to example embodiments.
Figure 53:
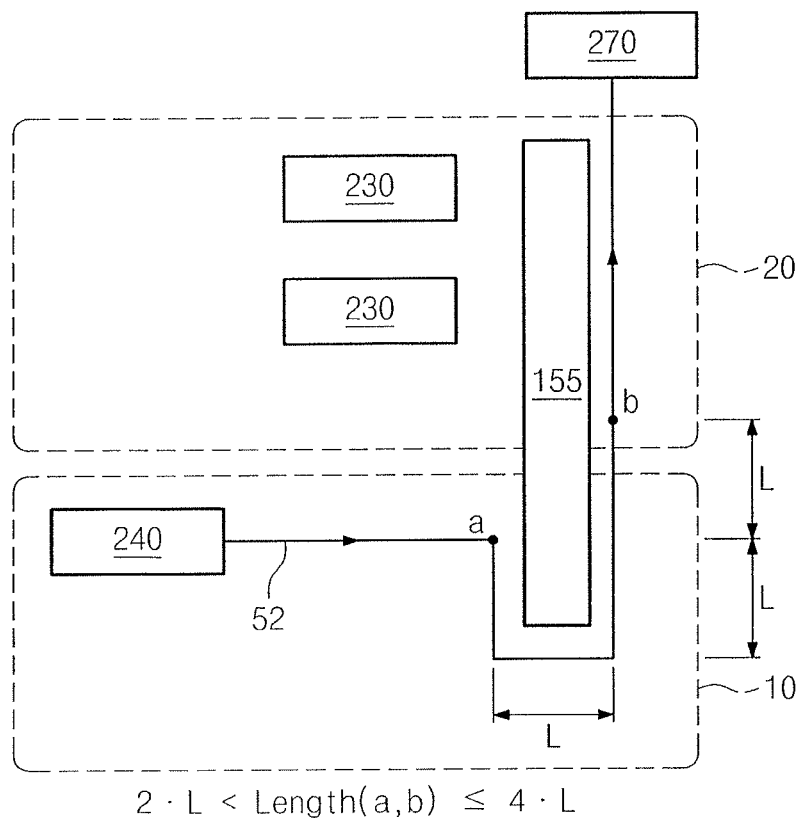
FIG. 53 illustrates a schematic diagram of a current pathway through a comparative semiconductor device.

FIGS. 52 and 53 are schematic diagrams presented to describe some aspects of the inventive concepts. According to example embodiments of the inventive concepts, the first and second semiconductor patterns 165 and 175 may form a pathway 51 electrically connecting the lower structure 10 and the upper structure 20, in response to an electric signal applied to the conductive patterns 230.

In some embodiments, the pathway 51 may be bent depending on a connection structure between the lower structure 10 and the upper structure 20, like the embodiments described with reference to FIGS. 9 through 14. Therefore, as shown in FIG. 52, the pathway 51 may be configured to extend along a region adjacent to the conductive pattern 230. As a result, an electric current passing through the pathway 51 can be easily controlled by the conductive pattern 230.

In addition, according to example embodiments of the inventive concepts, since a bottom surface of the vertical pattern 155 is positioned at a level equivalent to or higher than the top surface of the lower structure 10, it may be possible to prevent the electric pathway 51 from being elongated by the presence of the vertical pattern 155. For instance, as shown in FIG. 52, a path length between two points a and b disposed on the pathway 51 may be equivalent to or smaller than 2 L, which is given by the absence of such a bending.

In contrast, if a vertical pattern (or an insulation spacer) extends into the lower structure 10, as illustrated in FIG. 53, a resultant electric pathway 52 extends to surround the vertical pattern, thereby forming an elongated current pathway. In other words, the distance between the two points a and b in FIG. 53 may be increased, e.g., as compared to the distance between the two points a and b in FIG. 52. The increased distance causes an increased electric pathway, which in turn, increases the electric resistance. In addition, since a portion of the electric pathway 52 is formed along a region spaced apart from the conductive pattern 230, it may be hard to control an electric current passing through the electric pathway 52.

Figure 54:
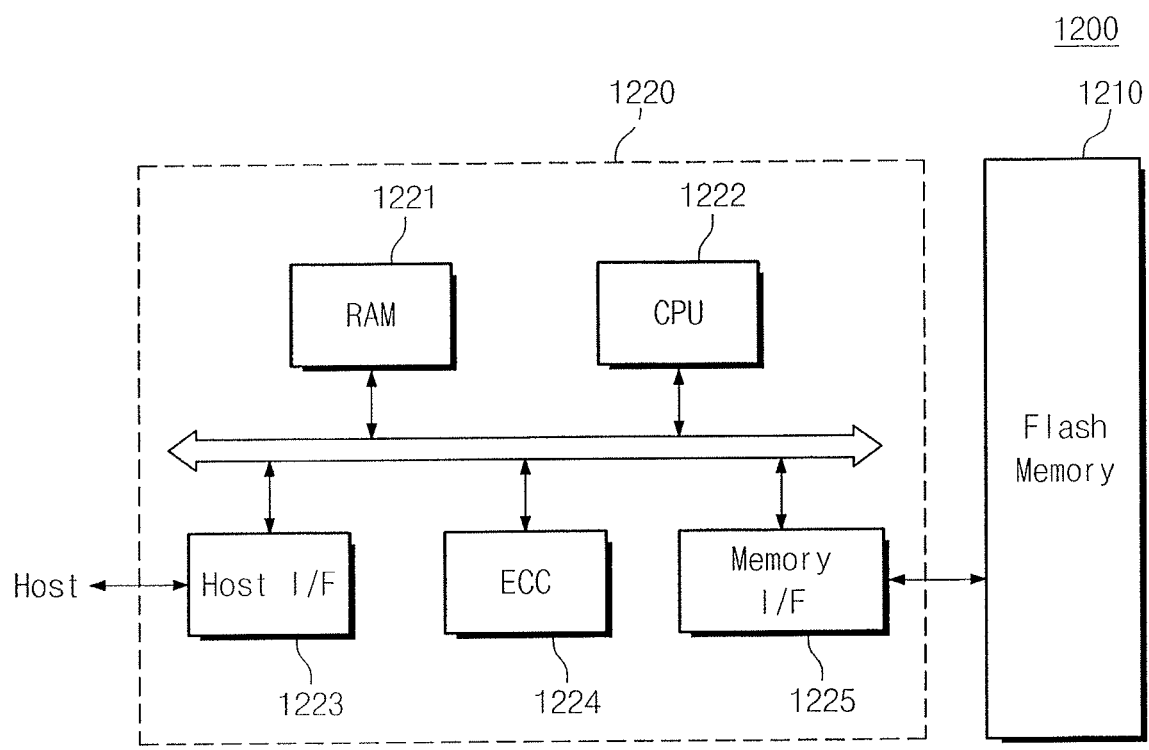
FIG. 54 illustrates a block diagram of memory cards equipped with semiconductor memory devices according to example embodiments.

FIG. 54 is a block diagram illustrating memory cards 1200 including flash memory devices 1210 according to example embodiments of the inventive concepts.

Referring to FIG. 54, the memory card 1200 for supporting a data storage capability of high capacity may include a flash memory device 1210, for example, including a 3D memory device as described with respect to example embodiments illustrated in FIGS. 1-53. The memory card 1200 according to example embodiments of the inventive concepts may include a memory controller 1220 controlling general data exchanges between a host and the flash memory device 1210.

A RAM 1221, e.g., a SRAM, may be used as an operating memory of a processing unit 1222. A host interface 1223 may include a data exchange protocol of a host connected to a memory card 1200. An error correction block 1224 may detect and correct errors included in data read from a multi-bit flash memory device 1210. A memory interface 1225 may interface with the flash memory device 1210 of example embodiments of the inventive concepts. A processing unit 1222 may perform general control operations for data exchange of the memory controller 1220. Although not shown in the drawing, it is apparent to those skilled in the art that the memory card 1200 may further include ROM (not shown) storing code data to interface with a host.

Figure 55:
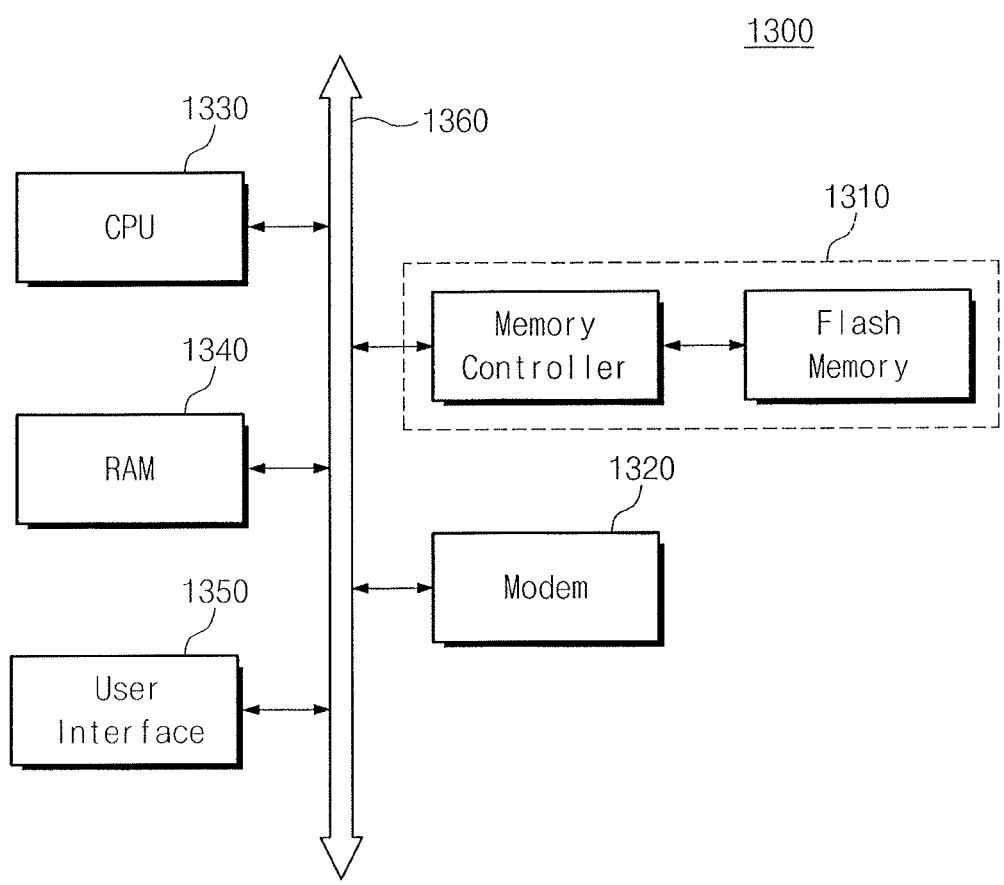
FIG. 55 illustrates a block diagram of information processing systems including memory systems according to example embodiments of the inventive concepts.

FIG. 55 is a block diagram illustrating information processing systems 1300 including flash memory systems 1310 according to example embodiments of the inventive concepts.

Referring to FIG. 55, the flash memory system 1310 may be mounted on an information processing system, for example, a mobile device and/or a desktop computer. The information processing system 1300 may include a flash memory system 1310, a modem 1320, a central processing unit (CPU) 1330, a RAM 1340, and a user interface 1350, electrically connected to a system bus 1360. The flash memory system 1310 may be configured substantially identical to the memory system and/or flash memory system described with respect to FIG. 54. Data processed by the CPU 1330 and/or input from the outside may be stored in the flash memory system 1310. A memory system 1310 may be a solid state drive SSD. The information processing system 1300 may stably store a large amount of data in the flash memory system 1310. As reliability of the information processing system 1300 may be increased, the flash memory system 1310 may conserve resources used for error correction, and a data exchange function of high speed may be provided to the information processing system 1310. Although not shown in the drawing, it is apparent to those of ordinary skill in the art that the information processing system 1300 of example embodiments of the inventive concepts may include an application chipset, a camera image processor (CIS), and/or an input/output device.

A flash memory device and/or a memory system of example embodiments of the inventive concepts may be mounted using various kinds of packages. For instance, the flash memory device and/or the memory system may be mounted with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to example embodiments of the inventive concepts, a vertical pattern may be interposed between an interlayer dielectric and a semiconductor pattern in terms of a horizontal position, and may have a bottom surface positioned at a level equivalent to or higher than a top surface of a lower structure in terms of a vertical position. Accordingly, the entire inner wall of a hole, which is formed on the top surface of the lower structure, may be in direct contact with a semiconductor pattern inserted therein. As a result, a length of an electric pathway between the lower structure (e.g., a semiconductor substrate) and the semiconductor pattern may be decreased. That is, the structure of the vertical pattern according to example embodiments may facilitate construction of a more direct route between the lower structure and the semiconductor pattern, thereby minimizing electrical resistance of an electric current path of a three-dimensional semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
   a semiconductor substrate, an underlying layer on the semiconductor substrate,
   and a first structure on the underlying layer;
   an opening penetrating at least the first structure;
   an insulating spacer on an inner wall of the opening;

a recessed hole disposed at a lower end of the opening and exposing a portion of the semiconductor substrate and a portion of the underlying layer; and a semiconductor pattern covering the insulating spacer in the opening and being in direct contact with an inner wall of the recessed hole, wherein a bottom surface of the insulating spacer is positioned at a vertical level between top and bottom surfaces of the underlying layer, and the bottom surface of the insulating spacer is spaced apart from a top surface of the semiconductor substrate.

2. The device as claimed in claim 1, wherein the semiconductor pattern is directly connected to the semiconductor substrate.

3. The device as claimed in claim 2, wherein the semiconductor substrate includes:

a doped region apart from the semiconductor pattern, the doped region having a different conductivity type from the semiconductor pattern; and a connection region directly connected to the semiconductor pattern, the connection region having the same conductivity type as the semiconductor pattern.

4. The device as claimed in claim 1, further comprising a selection transistor interposed between the semiconductor substrate and the first structure.

5. The device as claimed in claim 1, wherein the semiconductor pattern is in direct contact with the bottom surface of the insulating spacer.

6. The device as claimed in claim 1, wherein a distance between the bottom surface of the insulating spacer and an uppermost surface of the semiconductor substrate is less than a thickness of one conductive pattern in the first structure.

7. The device as claimed in claim 1, wherein the underlying layer is formed of aluminum oxide.

8. The device as claimed in claim 1, wherein the insulating spacer includes at least one of a tunnel insulating layer, a blocking insulating layer, and a charge storing layer.

9. The device as claimed in claim 1, wherein the insulating spacer has a cylindrical shape with an open end.

10. The device as claimed in claim 1, wherein the semiconductor pattern has a cylindrical shape with an open end.

11. The device as claim in claim 1, wherein the first structure includes three-dimensionally arranged memory devices.

12. A three-dimensional semiconductor device, comprising:

a semiconductor substrate;

an underlying layer on the semiconductor substrate;

a first structure on the underlying layer, the first structure including three-dimensionally arranged memory devices and having a first semiconductor pattern penetrating the first structure;

a second structure on the first structure, the second structure including at least a conductive pattern and having a second semiconductor pattern penetrating the second structure; and a pad pattern between the first structure and the second structure, wherein the first structure and the second structure electrically are connected to each other via the first semiconductor pattern and the second semiconductor pattern, a lower end of the second semiconductor pattern is disposed on and proximal to an upper end of the first semiconductor pattern, a lower end of the first semiconductor pattern is in contact with the semiconductor substrate and an upper end of the second semiconductor pattern is electrically connected to a bit line, and a bottom surface of the second semiconductor pattern is located at a vertical level between top and bottom surfaces of the pad pattern.

13. The device as claimed in claim 12, wherein the underlying layer is formed of aluminum oxide.

14. The device as claimed in claim 12, a first insulating spacer between the first structure and the first semiconductor pattern; and a second insulating spacer between the second structure and the second semiconductor pattern, wherein a bottom surface of the first insulating spacer is spaced apart from a top surface of the semiconductor substrate, and a bottom surface of the second insulating spacer is spaced apart from a top surface of the pad pattern.

* * * * *